(12) United States Patent
Huo et al.

(10) Patent No.: US 11,024,384 B2
(45) Date of Patent: *Jun. 1, 2021

(54) MEMORY DEVICE USING COMB-LIKE ROUTING STRUCTURE FOR REDUCED METAL LINE LOADING

(71) Applicant: Yangtze Memory Technologies Co., Ltd., Hubei (CN)

(72) Inventors: Zongliang Huo, Hubei (CN); Li Hong Xiao, Hubei (CN); Zhiliang Xia, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,606

(22) Filed: Jun. 29, 2020

(65) Prior Publication Data
US 2020/0335167 A1   Oct. 22, 2020

Related U.S. Application Data

(63) Continuation of application No. 16/168,157, filed on Oct. 23, 2018, now Pat. No. 10,762,965, which is a
(Continued)

(51) Int. Cl.
*G11C 16/08* (2006.01)
*G11C 16/04* (2006.01)
(Continued)

(52) U.S. Cl.
CPC .......... *G11C 16/08* (2013.01); *G11C 16/0483* (2013.01); *H01L 27/11556* (2013.01);
(Continued)

(58) Field of Classification Search
CPC ................ G11C 16/08; G11C 16/0483; H01L 27/11582; H01L 29/66757;
(Continued)

(56) References Cited

U.S. PATENT DOCUMENTS

| 2009/0278195 A1 | 11/2009 | Toba |
| 2010/0193861 A1 | 8/2010 | Shim et al. |

(Continued)

FOREIGN PATENT DOCUMENTS

| CN | 103137625 A | 6/2013 |
| CN | 103295966 A | 9/2013 |

(Continued)

OTHER PUBLICATIONS

International Search Report and Written Opinion of the International Searching Authority directed to related International Patent Application No. PCT/CN2018/104834, dated Jun. 4, 2019: 8 pages.

*Primary Examiner* — Mohammed A Bashar
(74) *Attorney, Agent, or Firm* — Sterne, Kessler, Goldstein & Fox P.L.L.C.

(57) ABSTRACT

Embodiments of three-dimensional memory device architectures and fabrication methods therefor are disclosed. In an example, the memory device includes a substrate and one or more peripheral devices on the substrate. The memory device also includes one or more interconnect layers and a semiconductor layer disposed over the one or more interconnect layers. A layer stack having alternating conductor and insulator layers is disposed above the semiconductor layer. A plurality of structures extend vertically through the layer stack. A first set of conductive lines are electrically coupled with a first set of the plurality of structures and a second set of conductive lines are electrically coupled with a second set of the plurality of structures different from the first set. The first and second sets of conductive lines are vertically distanced from opposite ends of the plurality of structures.

20 Claims, 18 Drawing Sheets

Related U.S. Application Data continuation of application No. PCT/CN2018/104834, filed on Sep. 10, 2018.

(51) Int. Cl.

| | | |
|---|---|---|
| *H01L 27/11556* | (2017.01) | |
| *H01L 27/11573* | (2017.01) | |
| *H01L 27/11582* | (2017.01) | |
| *H01L 29/423* | (2006.01) | |
| *H01L 29/66* | (2006.01) | |
| *H01L 29/786* | (2006.01) | |
| *H01L 29/792* | (2006.01) | |

(52) U.S. Cl.
CPC .. *H01L 27/11573* (2013.01); *H01L 27/11582* (2013.01); *H01L 29/42384* (2013.01); *H01L 29/66757* (2013.01); *H01L 29/78642* (2013.01); *H01L 29/7926* (2013.01)

(58) Field of Classification Search
CPC ........... H01L 29/42384; H01L 29/7926; H01L 27/11556; H01L 27/11573; H01L 29/78642

See application file for complete search history.

(56) References Cited

U.S. PATENT DOCUMENTS

| | | |
|---|---|---|
| 2012/0181602 A1 | 7/2012 | Fukuzumi |
| 2016/0307632 A1 | 10/2016 | Lee et al. |
| 2017/0186750 A1 | 6/2017 | Singh et al. |
| 2019/0013326 A1 | 1/2019 | Hua et al. |
| 2019/0287995 A1* | 9/2019 | Oike ................. H01L 27/11519 |
| 2020/0082886 A1 | 3/2020 | Huo et al. |

FOREIGN PATENT DOCUMENTS

| | | |
|---|---|---|
| CN | 106876401 A | 6/2017 |
| CN | 107658315 A | 2/2018 |
| CN | 107658317 A | 2/2018 |
| WO | WO 2019/052127 A1 | 3/2019 |

* cited by examiner

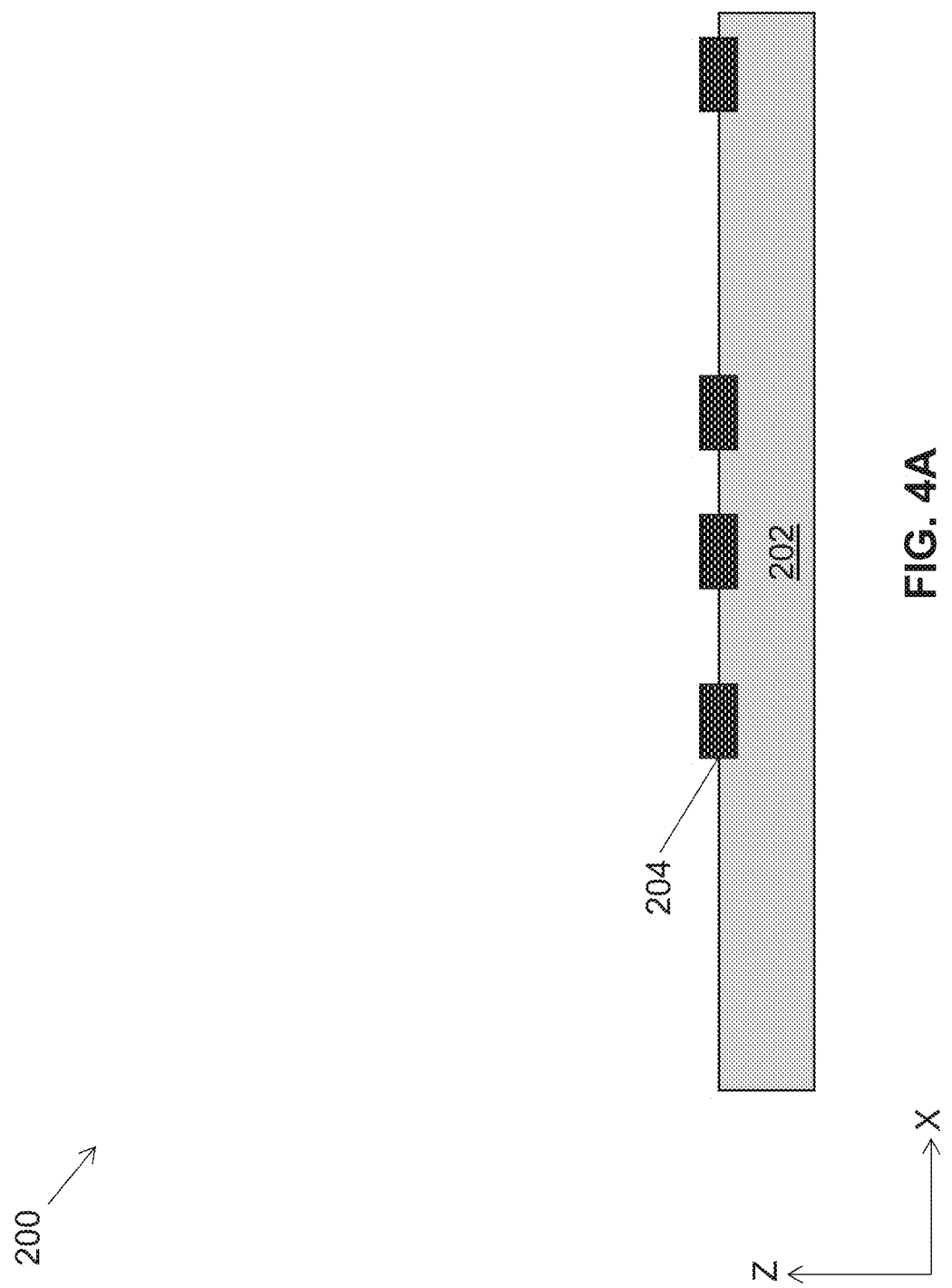

MEMORY DEVICE USING COMB-LIKE ROUTING STRUCTURE FOR REDUCED METAL LINE LOADING

CROSS-REFERENCE TO RELATED APPLICATIONS

This application is a continuation of U.S. Non-provisional patent application Ser. No. 16/168,157 filed on Oct. 23, 2018 and titled "Memory Device Using Comb-like Routing Structure for Reduced METAL line Loading," which claims priority to PCT Patent Application No. PCT/CN2018/104834, filed on Sep. 10, 2018, both of which are incorporated herein by reference in their entirety.

BACKGROUND

Embodiments of the present disclosure relate to three-dimensional (3D) memory devices and fabrication methods thereof.

Flash memory devices have undergone rapid development. Flash memory devices can store data for a considerably long time without powering (i.e., they are a form of non-volatile memory), and have advantages such as high integration level, fast access, easy erasing, and rewriting. To further improve the bit density and reduce cost of flash memory devices, three-dimensional NAND flash memory devices have been developed.

A three-dimensional NAND flash memory device includes a stack of gate electrodes arranged over a substrate, with a plurality of semiconductor channels through and intersecting word lines, into the p- and/or n-type implanted substrate. The bottom/lower gate electrodes function as bottom/lower selective gates (BSG). The top/upper gate electrodes function as top/upper selective gates (TSG). Back-End-of Line (BEOL) Metal plays the role of Bit-Lines (BLs). The word lines/gate electrodes between the top/upper selective gate electrodes and the bottom/lower gate electrodes function as word lines (WLs). The intersection of a word line and a semiconductor channel forms a memory cell. WLs and BLs are typically laid perpendicular to each other (e.g., in an X-direction and a Y-direction), and TSGs are laid in a direction perpendicular to both the WLs and BLs (e.g., in a Z-direction.)

BRIEF SUMMARY

Embodiments of three-dimensional memory device architectures and fabrication methods therefore are disclosed herein. The disclosed structures and methods provide a staggered fabrication for various metal lines, such as the bit lines, to reduce the density of the metal lines on the same plane. Reducing the metal line density leads to reduced cross-talk between the lines and faster program speeds.

In some embodiments, a memory device includes a substrate and one or more peripheral devices on the substrate. The memory device also includes one or more interconnect layers electrically coupled with the one or more peripheral devices, and a semiconductor layer disposed over the one or more interconnect layers. A layer stack having alternating conductor and insulator layers is disposed above the semiconductor layer. A plurality of structures extend vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures.

In some embodiments, the memory device further includes one or more second interconnect layers, the one or more second interconnect layers being electrically coupled to the second set of conductive lines.

In some embodiments, the one or more second interconnect layers comprises conductive pads configured to provide electrical connection to external devices.

In some embodiments, the plurality of structures includes one or more NAND memory strings.

In some embodiments, the one or more NAND strings each includes a plurality of layers surrounding a core insulating material, wherein the plurality of layers includes a blocking layer, a storage layer, a tunneling layer, and a channel layer.

In some embodiments, the plurality of structures comprises one or more conductive contacts.

In some embodiments, the first set of the plurality of structures includes only the NAND memory strings and the second set of the plurality of structures includes only the conductive contacts.

In some embodiments, the second set of conductive lines are located on an opposite side of the semiconductor layer from the first set of conductive lines.

In some embodiments, the first semiconductor structure further includes a plurality of conductive pads configured to provide electrical connection to external devices.

In some embodiments, the memory device further includes further includes vias extending through a thickness of the semiconductor layer, where the vias electrically contact the first set of conductive lines and the first set of the plurality of structures.

In some embodiments, a memory device includes a substrate, a dielectric material disposed on a first surface of the substrate, a semiconductor layer disposed on the dielectric material, and a layer stack having alternating conductor and insulator layers disposed on the semiconductor layer. The memory device also includes a plurality of structures extending vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures. The memory device also includes one or more peripheral devices formed on a second surface of the substrate, the second surface being opposite to the first surface.

In some embodiments, the plurality of structures includes one or more NAND memory strings.

In some embodiments, the one or more NAND strings each includes a plurality of layers surrounding a core insulating material, wherein the plurality of layers includes a blocking layer, a storage layer, a tunneling layer, and a channel layer.

In some embodiments, the plurality of structures comprises one or more conductive contacts.

In some embodiments, the first set of the plurality of structures includes only the NAND memory strings and the second set of the plurality of structures includes only the conductive contacts.

In some embodiments, the second set of conductive lines are located on an opposite side of the semiconductor layer from the first set of conductive lines.

In some embodiments, the first set of conductive lines are disposed in the dielectric material.

In some embodiments, the memory device includes one or more interconnect layers coupled to the one or more peripheral devices.

In some embodiments, the memory device further includes further includes vias extending through a thickness of the substrate, where the vias electrically contact the first set of conductive lines and the one or more interconnect layers.

In some embodiments, the one or more interconnect layers includes conductive pads designed to provide electrical connection to external devices.

In some embodiments, a method to form a memory device includes forming one or more peripheral devices on a substrate and one or more interconnect layers over the one or more peripheral devices. The one or more interconnect layers are electrically coupled with the one or more peripheral devices. The method also includes forming a first set of conductive lines electrically coupled with the one or more interconnect layers, and forming a semiconductor layer over the first set of conductive lines. The method includes forming vias through a thickness of the semiconductor layer where the vias are electrically coupled to the first set of conductive lines. The method also includes forming, on the semiconductor layer, a layer stack having alternating conductor and insulator layers. The method includes forming a plurality of structures each extending vertically through the layer stack. A first set of the plurality of structures is electrically coupled to the first set of conductive lines using the vias. The method also includes forming a second set of conductive lines over an end vertically distanced from the plurality of structures. The second set of conductive lines is electrically coupled to a second set of the plurality of structures different from the first set.

In some embodiments, a method to form a memory device includes forming a first set of conductive lines over a first surface of a substrate, the first set of conductive lines being surrounded by a dielectric layer on the first surface of the substrate. The method also includes forming a semiconductor layer over the first set of conductive lines, and forming vias through a thickness of the semiconductor layer. The vias are electrically coupled to the first set of conductive lines. The method also includes forming, on the semiconductor layer, a layer stack having alternating conductor and insulator layers. The method includes forming a plurality of structures each extending vertically through the layer stack. A first set of the plurality of structures is electrically coupled to the first set of conductive lines using the vias. The method also includes forming a second set of conductive lines over an end vertically distanced from the plurality of structures. The second set of conductive lines are electrically coupled to a second set of the plurality of structures different from the first set. The method also includes forming one or more peripheral devices on a second surface of the substrate opposite from the first surface.

The three-dimensional memory devices provided by the present disclosure include bit lines and other metal routing lines that are provided at different heights above (or below) the substrate such that they are not densely packed on the same plane.

BRIEF DESCRIPTION OF THE DRAWINGS

Aspects of the present disclosure are best understood from the following detailed description when reading with the accompanying figures. It is noted that, in accordance with the common practice in the industry, various features are not drawn to scale. In fact, the dimensions of the various features may be arbitrarily increased or reduced for clarity of illustration and discussion.

FIGS. 4A-4H illustrate side views of a three-dimensional memory structure at different stages of an exemplary fabrication process, according to some embodiments.

DETAILED DESCRIPTION

Figure 1:
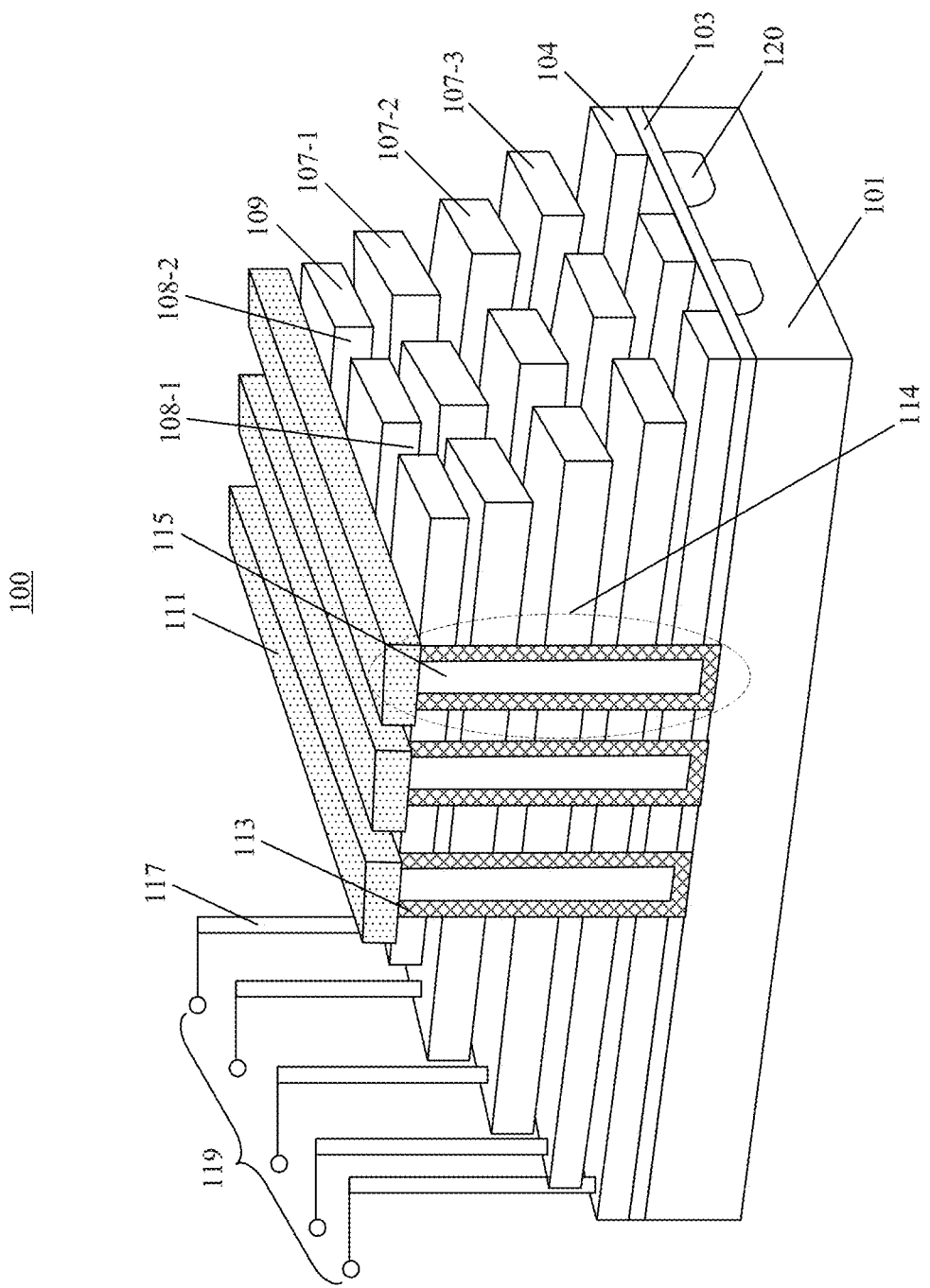
FIG. 1 is an illustration of a three-dimensional memory device.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

Any of the memory devices described herein can be used in an electronic system, such as, for example, portable electronics, computers, or wearable electronics.

FIG. 1 illustrates a portion of a three-dimensional NAND flash memory device 100. The flash memory device 100 includes a substrate 101, an insulating layer 103 over substrate 101, a tier of lower selective gate electrodes 104 over the insulating layer 103, and a plurality of tiers of control gate electrodes 107 stacking on top of bottom selective gate electrodes 104 to form an alternating conductor/dielectric stack. The flash memory device also includes a tier of upper selective gate electrodes 109 over the stack of control gate electrodes 107, doped source line regions 120 in portions of substrate 101 between adjacent lower selective gate electrodes 104, and NAND strings 114 through upper selective gate electrodes 109, control gate electrodes 107, lower selective gate electrodes 104, and insulating layer 103. NAND strings 114 includes a memory film 113 over the inner surface of NAND strings 114 and a core filling film 115 surrounded by memory film 113. The flash memory device 100 further includes a plurality of bit lines 111 connected to NAND strings 114 over upper selective gate electrodes 109 and a plurality of metal interconnects 119 connected to the gate electrodes through a plurality of metal contacts 117. Insulating layers between adjacent tiers of gate electrodes are not shown in FIG. 1 for clarity. The gate electrodes include upper selective gate electrodes 109, control gate electrodes 107 (e.g., also referred to as the word lines), and lower selective gate electrodes 104.

In FIG. 1, for illustrative purposes, three tiers of control gate electrodes 107-1, 107-2, and 107-3 are shown together with one tier of upper selective gate electrodes 109 and one tier of lower selective gate electrodes 104. Each tier of gate electrodes have substantially the same height over substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all upper selective gate electrodes 109, control gate electrodes 107, and lower selective gate electrodes 104). Further, the same number of metal interconnects is formed to connect to each metal contact via. In some arrangements, additional metal contacts are formed to connect to other structures beyond the gate electrodes, such as, for example, dummy structures.

When forming NAND strings 114, other vertical structures may also be formed that extend through the tiers of control gate electrodes 107-1, 107-2, and 107-3 down to substrate 101. Examples of other vertical structures include through array contacts (TACs) that may be used to make electrical connection with components above and/or below the tiers of gate electrodes. These other vertical structures are not illustrated in FIG. 1 for clarity.

Figure 2:
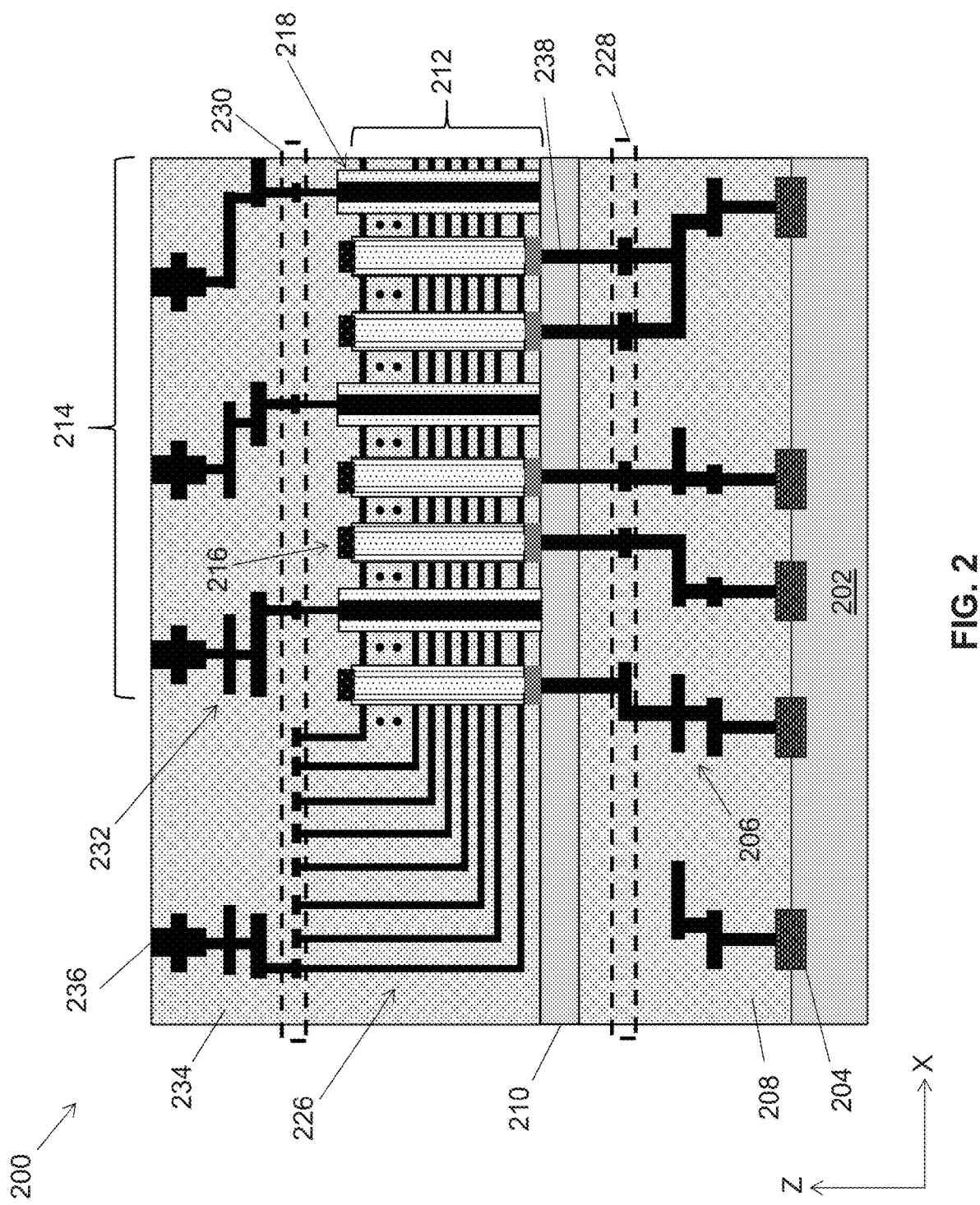
FIG. 2 illustrates a cross-section view of a three-dimensional memory device, according to some embodiments.
Figure 3:
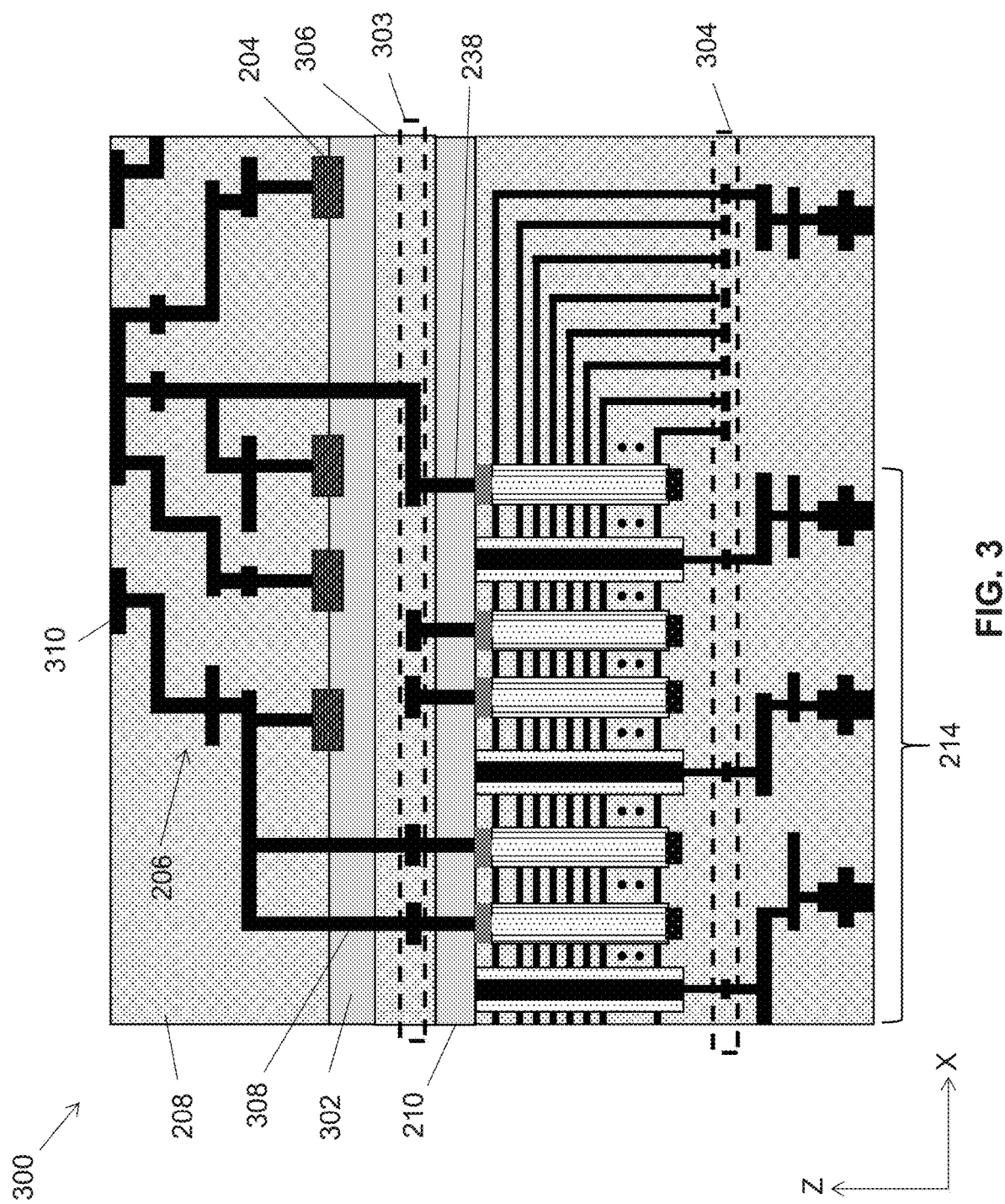
FIG. 3 illustrates a cross-section view of another three-dimensional memory device, according to some embodiments.

For illustrative purposes, similar or same parts in a three-dimensional NAND device are labeled using same element numbers. However, element numbers are merely used to distinguish relevant parts in the Detailed Description and do not indicate any similarity or difference in functionalities, compositions, or locations. Structure 200 illustrated in FIG. 2 provides a side view of a three-dimensional NAND memory device, according to some embodiments. Structure 300 illustrated in FIG. 3 provides a side view of another three-dimensional NAND memory device, according to some embodiments. FIGS. 4A-4H illustrate an example fabrication process for forming the three-dimensional NAND memory device illustrated in FIG. 2, according to some embodiments. FIGS. 5A-5E illustrate an example fabrication process for forming the three-dimensional NAND memory device illustrated in FIG. 3, according to some embodiments. Other parts of the memory devices are not shown for ease of description. Although using three-dimensional NAND devices as examples, in various applications and designs, the disclosed structures can also be applied in similar or different semiconductor devices to, e.g., reduce the density of metal connections or wiring. The specific application of the disclosed structures should not be limited by the embodiments of the present disclosure. For illustrative purposes, word lines and gate electrodes are used interchangeably to describe the present disclosure.

FIG. 2 illustrates an exemplary memory device 200, according to some embodiments. Memory device 200 includes a substrate 202. Substrate 202 can provide a platform for forming subsequent structures. Such subsequent structures are formed on a front (e.g., top) surface of substrate 202. And such subsequent structures are said to be formed in a vertical direction (e.g., orthogonal to the front surface of substrate 202.) In FIG. 2, and for all subsequent illustrated structures, the X and Y directions are along a plane parallel to the front and back surfaces of substrate 202, while the Z direction is in a direction orthogonal to the front and back surfaces of substrate 202.

In some embodiments, substrate 202 includes any suitable material for forming the three-dimensional memory device. For example, substrate 202 can include silicon, silicon germanium, silicon carbide, silicon on insulator (SOI), germanium on insulator (GOI), glass, gallium nitride, gallium arsenide, and/or other suitable III-V compound.

Substrate 202 can include one or more peripheral devices 204. Peripheral devices 204 can be formed "on" substrate 202, in which the entirety or part of the peripheral device 204 is formed in substrate 202 (e.g., below the top surface of substrate 202) and/or directly on substrate 202. Any of peripheral devices 204 can include transistors formed on substrate 202. Doped regions to form source/drain regions of the transistors can be formed in substrate 202 as well, as would be understood to one skilled in the relevant art.

In some embodiments, peripheral devices 204 can include any suitable digital, analog, and/or mixed-signal peripheral circuits used for facilitating the operation of memory device 200. For example, peripheral devices 204 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, peripheral devices 204 are formed on substrate 202 using complementary metal-oxide-semiconductor (CMOS) technology (also known as a "CMOS chip").

One or more peripheral interconnect layers 206 can be included above peripheral devices 204 to transfer electrical signals to and from peripheral devices 204. Peripheral interconnect layers 206 can include one or more contacts and one or more interconnect conductor layers each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines). Peripheral interconnect layers 206 can further include one or more interlayer dielectric (ILD) layers, generally represented by dielectric material 208. The contacts and the conductor layers in peripheral interconnect layers 206 can include conductor materials including, but not limited to, tungsten (W), cobalt (Co), copper (Cu), aluminum (Al), silicides, or any combination thereof. Dielectric material 208 can include silicon oxide, silicon nitride, silicon oxynitride, doped silicon oxide, or any combination thereof.

A semiconductor layer 210 is disposed over dielectric material 208 and peripheral interconnect layers 206, according to some embodiments. Semiconductor layer 210 can be epitaxially grown silicon or any other epitaxially grown semiconducting material. Semiconductor layer 210 can also be deposited using well-known vapor deposition techniques such as chemical vapor deposition (CVD) or physical vapor deposition (PVD) techniques.

A layer stack 212 that includes alternating conductor and insulator layers is disposed on semiconductor layer 210. Any number of alternating conductor/insulator layers may be used in layer stack 212. The conductor layers can each have the same thickness or have different thicknesses. Similarly, the insulator layers can each have the same thickness or have different thicknesses. The conductor layers can include conductor materials including, but not limited to, W, Co, Cu, Al, doped silicon, silicides, or any combination thereof. The insulator layers can include dielectric materials including, but not limited to, silicon oxide, silicon nitride, silicon oxynitride, or any combination thereof. In some embodiments, the insulator layers represent empty space (e.g., vacuum).

Extending vertically through layer stack 212, and over semiconductor layer 210, is a plurality of structures 214. Plurality of structures 214 can include any number of NAND memory strings 216 and/or conductive contacts 218. Each of NAND memory strings 216 provides a plurality of memory bit locations controlled by voltage applied to corresponding word lines (e.g., the conductor layers of layer stack 212). One or both of the conductive top and bottom portions of each of NAND memory strings 216 can be coupled to bit lines that control current flow through a channel layer of each NAND memory string 216.

Conductive contacts 218 can be through array contacts (TAC). Conductive contacts 218 can extend through layer stack 212 and deliver signals to conductive layers or pads disposed both above and below layer stack 212.

According to some embodiments, memory device 200 includes two different levels of contact lines for making contact with each of plurality of structures 214. For example, a first set of conductive lines 228 can be located on one side of plurality of structures 214 (in the z direction), and a second set of conductive lines 230 can be located on an opposite side of plurality of structures 214 (in the z direction). Each of first and second sets of conductive lines 228 and 230 can include bit lines coupled to one or more of NAND memory strings 216, word lines coupled to the conductive layers of layer stack 212 using conductive vias 226, and other contact lines coupled to conductive contacts 218. By splitting such conductive lines between separate locations, the density of the lines in a single location is decreased, leading to reduced cross-talk and faster operation speeds of memory device 200.

The various conductive lines may be staggered between first set of conductive lines 228 and second set of conductive lines 230 in any fashion. The staggering of the conductive lines can create a comb-like arrangement of the conductive lines. In one example, each of conductive contacts 218 is connected to a corresponding conductive line in second set of conductive lines 230, and each of NAND memory strings 216 is connected to a corresponding bit line in first set of conductive lines 228. Each of NAND memory strings 216 can be connected to a corresponding bit line in first set of conductive lines 228 using vias 238 through a thickness of semiconductor layer 210. In another example, the conductive lines alternate between being located in either first set of conductive lines 228 or second set of conductive lines 230 along the x-direction for each of plurality of structures 214. In yet another example, the bit lines connected to NAND memory strings 216 are staggered such that the bit lines alternate between being located in first set of conductive lines 228 and second set of conductive lines 230 along the x-direction for each of NAND memory strings 216. Any other arrangements are possible as well, so long as the conductive lines coupled to each of plurality of structures 214 are not all located along the same plane.

In some embodiments, any first set of structures of plurality of structures 214 can be coupled to conductive lines in the first set of conductive lines 228, and any second set of structures of plurality of structures 214 can be coupled to conductive lines in the second set of conductive lines 230. In some embodiments, the first set of structures can include all NAND memory strings 216 and the second set of structures can include all conductive contacts 218. The first set of structures can be different than the second set of structures. Furthermore, in some embodiments, the first set of structures includes entirely different structures than the second set of structures. In some embodiments, second set of conductive lines 230 are disposed over an opposite side of semiconductor layer 210 in the z-direction compared to first set of conductive lines 228.

Memory device 200 includes one or more interconnect layers 232 having substantially the same properties as peripheral interconnect layers 206. Interconnect layers 232 can further include one or more interlayer dielectric (ILD) layers, generally represented by dielectric material 234. Dielectric material 234 can be similar to dielectric material 208. Interconnect layers 232 can include conducive pads 236 at a top surface of semiconductor device 200. Conductive pads 236 can be used to provide electrical connection to external devices and their use would be well understood to a person skilled in the relevant art.

FIG. 3 illustrates another example of a memory device 300, according to some embodiments. Memory device 300 is similar to memory device 200 and includes many of the same components, the details of which are not repeated in the description of memory device 300. However, the location and orientation of certain components are different between memory device 200 and memory device 300. The various components of memory device 200 are each disposed over one surface of substrate 202, while the various components of memory device 300 can be disposed on either surface of substrate 302. Substrate 302 can have similar properties as substrate 202. In some embodiments, substrate 302 is thinner than substrate 202.

Over a first surface of substrate 302, memory device 300 includes a dielectric material 306 followed by semiconductor layer 210. The formation of the memory array above semiconductor layer 210 is similar to that described in memory device 200.

Memory device 300 similarly includes two levels of contact lines for making contact with each of plurality of vertical structures 214. For example, a first set of conductive lines 303 can be located on one side of plurality of structures 214 (in the z direction), and a second set of conductive lines 304 can be located on an opposite side of plurality of structures 214 (in the z direction). The first set of conductive lines 303 can be located within dielectric material 306. First set of conductive lines 303 and second set of conductive lines 304 can be connected to various ones of plurality of structures 214 as described above for memory device 200.

Memory device 300 includes one or more peripheral devices 204 formed on a second surface of substrate 302 that is opposite from the first surface. One or more peripheral devices can be electrically coupled with peripheral interconnect layers 206 surrounded by dielectric material 208 as described above for memory device 200. Additionally, one or more of peripheral devices 204 can be electrically coupled to one or more of the first set of conductive lines 303 using vias 308 passing through a thickness of substrate 302.

Peripheral interconnect layers 206 can include conducive pads 310 at a top surface of semiconductor device 300. Conductive pads 310 can be used to provide electrical connection to external devices and their use would be well understood to a person skilled in the relevant art.

Figure 4B:
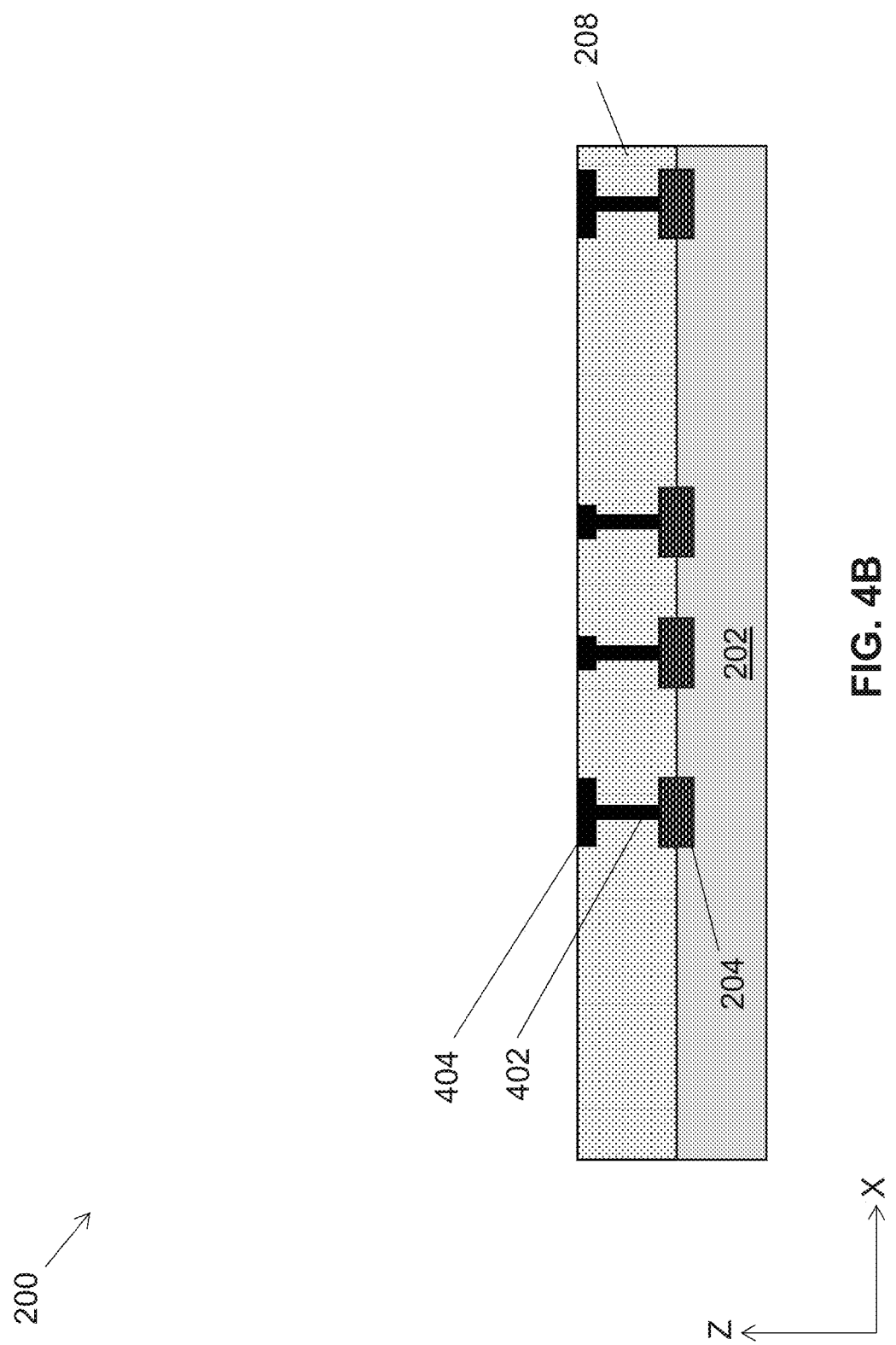

FIGS. 4A-4H illustrate an example fabrication process for forming memory device 200. FIG. 4A illustrates the formation of peripheral devices 204 on substrate 202. Peripheral devices 204 can include a plurality of transistors formed on substrate 202. The transistors can be formed by a plurality of processing steps including, but not limited to, photolithography, dry/wet etch, thin film deposition, thermal growth, implantation, chemical mechanical polishing (CMP), or any combination thereof. In some embodiments, doped regions are formed in substrate 202, which function, for example, as source regions and/or drain regions of the transistors. In some embodiments, isolation regions, such as shallow trench isolation (STI), is also formed in substrate 202. These particular features are not explicitly illustrated as they are well understood structures to a person skilled in the relevant art. Any arrangement of transistors or electrically passive devices (e.g., capacitors, resistors, etc.) may be provided on substrate 202.

FIG. 4B illustrates the formation of a first interconnect layer above peripheral devices 204. The first interconnect layer includes one or more contacts 402 and patterned conductor layers 404. Contacts 402 can be provided to contact either patterned features of peripheral devices 204 or portions of substrate 202. Conductor layers 404 represent conductive traces that extend into and out of the page. Contacts 402 and patterned conductor layers 404 can include conductor materials deposited by one or more thin film deposition processes including, but not limited to, CVD, PVD, ALD, electroplating, electroless plating, or any combination thereof. Fabrication processes to form the contacts and conductor layers can also include photolithography, CMP, wet/dry etch, or any combination thereof.

One or more deposited dielectric layers are represented by dielectric material 208. Dielectric material 208 can represent any number of deposited dielectric layers that include materials deposited by one or more thin film deposition processes including, but not limited to, CVD, PVD, ALD, or any combination thereof.

Figure 4C:
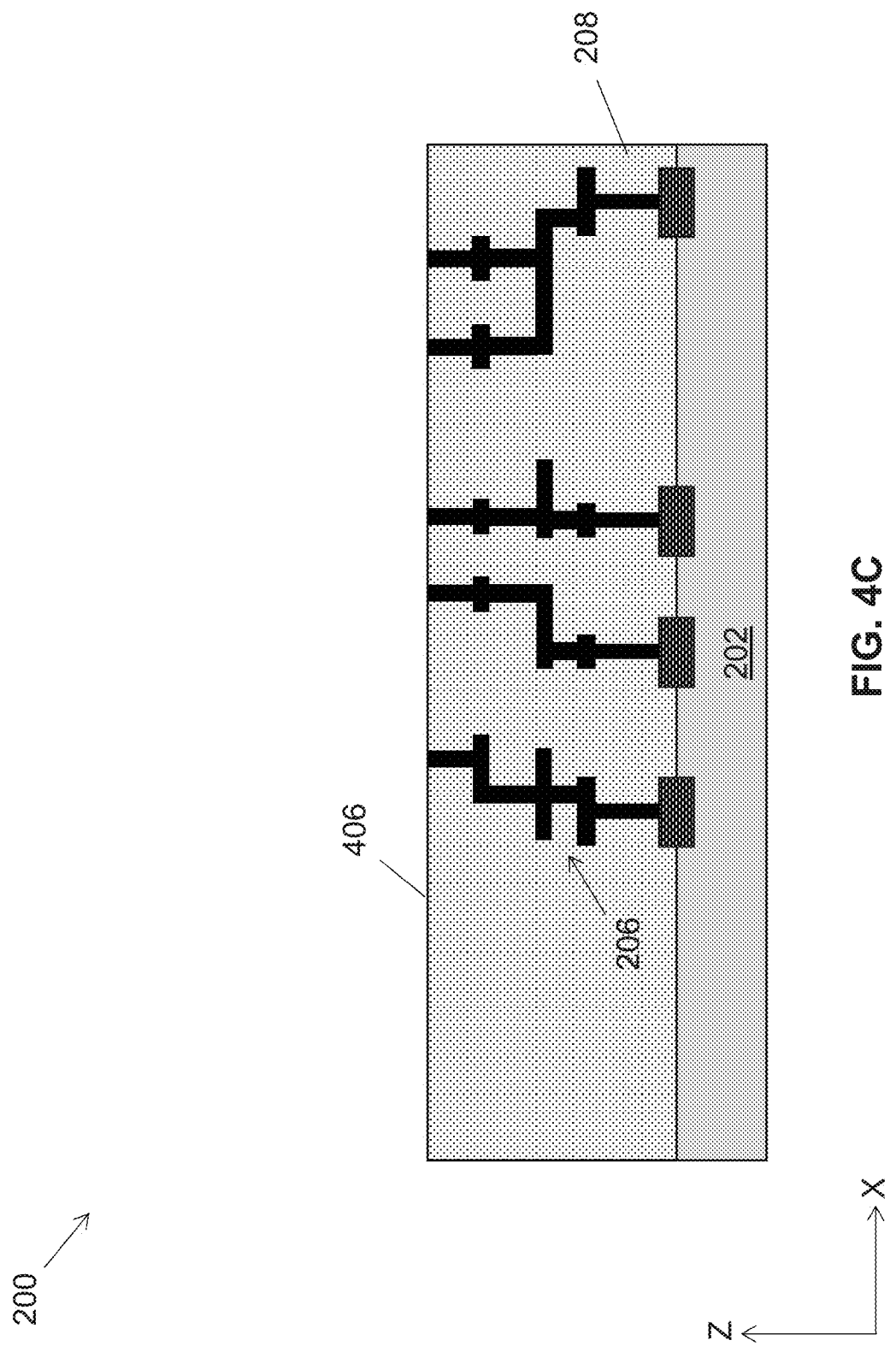

FIG. 4C illustrates the formation of one or more additional interconnect layers to form peripheral interconnect layers 206. Any number of interconnect layers may be formed each having vias connecting different levels of conductor layers. Additional dielectric layers are also deposited to increase a total thickness of dielectric material 208. A top surface 406 of dielectric material 208 can be planarized using a polishing technique, such as chemical mechanical polishing (CMP), according to some embodiments.

Figure 4D:
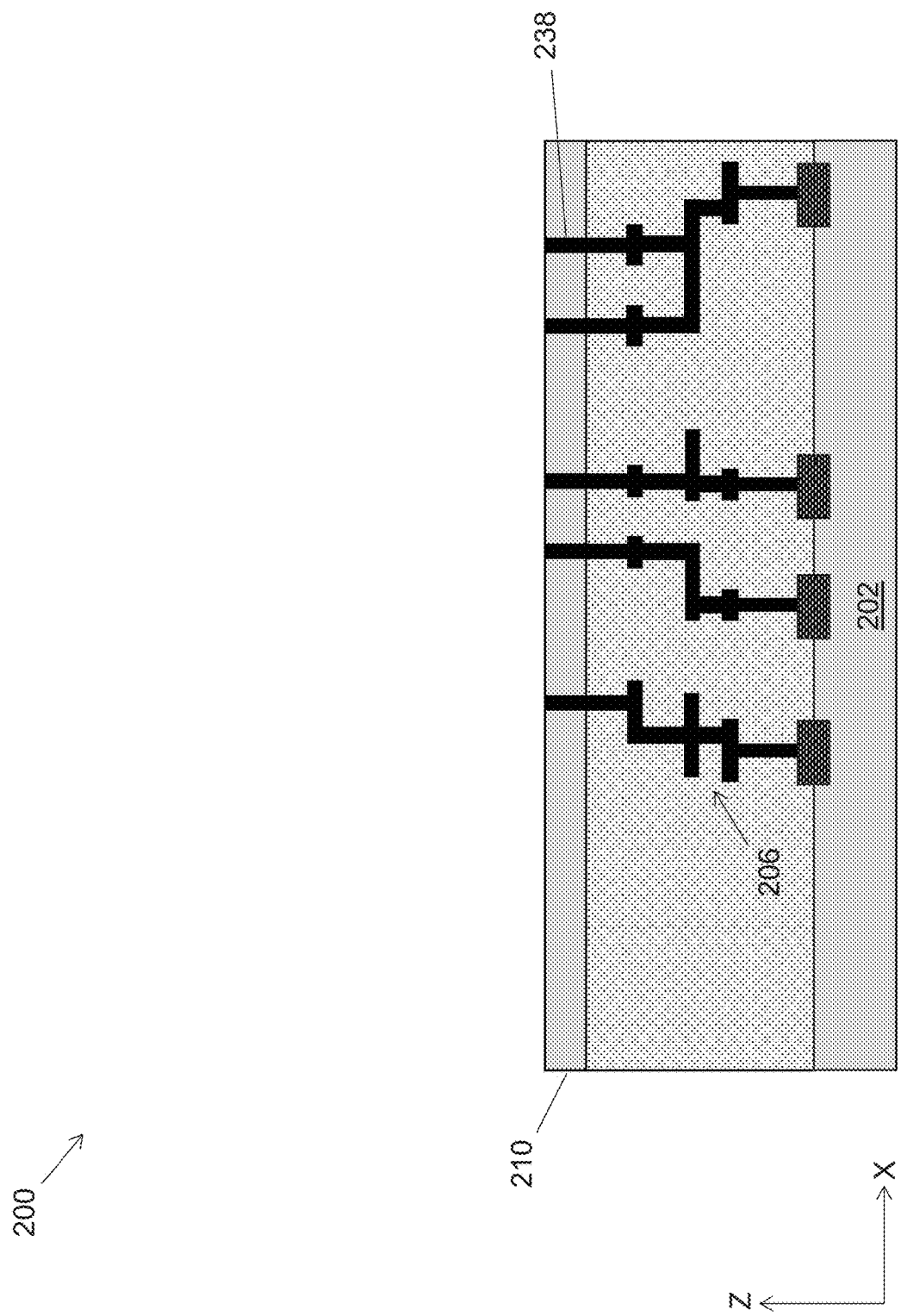

FIG. 4D illustrates the formation of semiconductor layer 210 over peripheral interconnect layers 206. Semiconductor layer 210 can be silicon that is epitaxially grown or any other semiconducting material that can be epitaxially grown. Semiconductor layer 210 can also be deposited using well-known vapor deposition techniques such as chemical vapor deposition (CVD) or physical vapor deposition (PVD) techniques. According to some embodiments, one or more conductive vias 238 are formed through a thickness of semiconductor layer 210. Conductive vias 238 can be electrically coupled with one or more layers of peripheral interconnect layers 206.

Figure 4E:
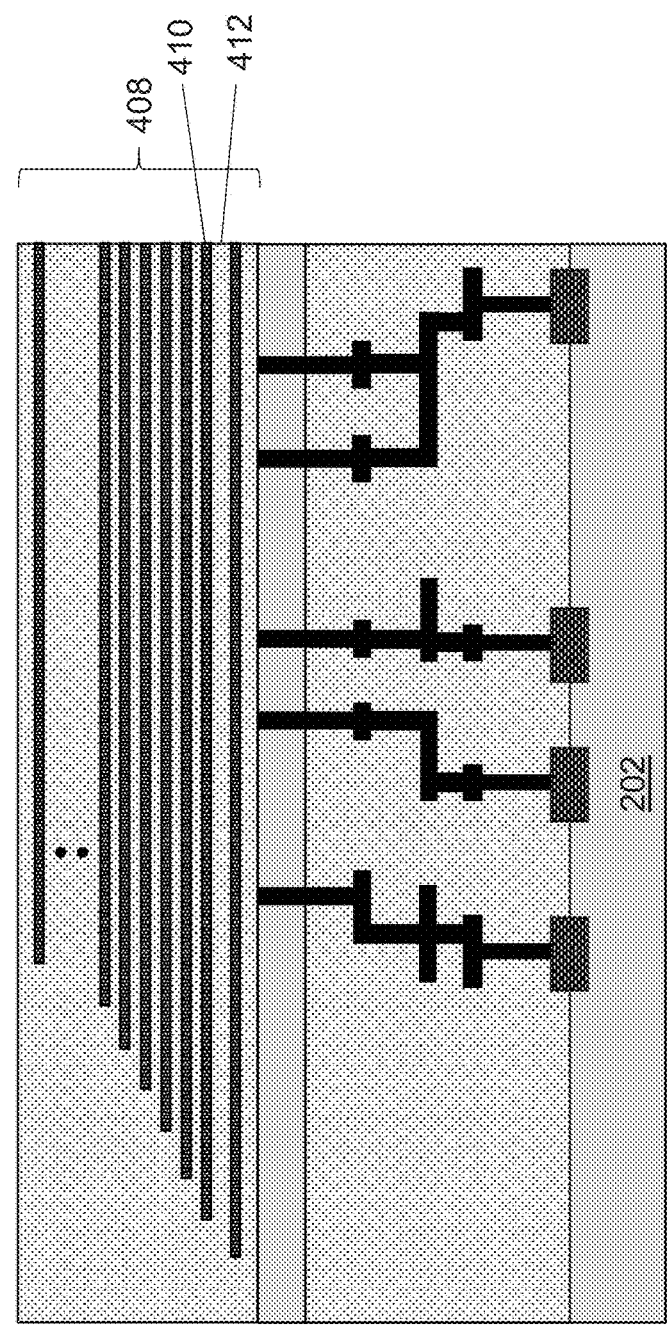

FIG. 4E illustrates the formation of a layer stack 408 having alternating sacrificial layers 410 and dielectric layers 412 formed over semiconductor layer 210, according to some embodiments.

The formation of layer stack 408 can involve depositing sacrificial layers 410 to each have the same thickness or to have different thicknesses. Example thicknesses of sacrificial layers 410 can range from 10 nm to 60 nm. Similarly, dielectric layers 412 can each have the same thickness or have different thicknesses. Example thicknesses of dielectric layers 412 can range from 10 nm to 60 nm.

The dielectric material of sacrificial layers 410 is different from the dielectric material of dielectric layers 412, according to some embodiments. For example, each of sacrificial layers 410 can be silicon nitride while each of dielectric layers 412 can be silicon dioxide. Other example materials for each of sacrificial layers 410 include poly-crystalline silicon, poly-crystalline germanium, and poly-crystalline germanium-silicon. The dielectric materials used for any of dielectric layers 412 or sacrificial layers 410 can include silicon oxide, silicon nitride, silicon oxynitride, or any combination thereof. It should be understood that any number of dielectric layers may be included in layer stack 408.

Layer stack 408 includes a portion having a staircase structure where each of at least sacrificial layers 410 terminate at a different length in the horizontal 'X' direction. This staircase structure allows for electrical contacts to connect each of the word lines of the memory device, as will be shown later.

Figure 4F:
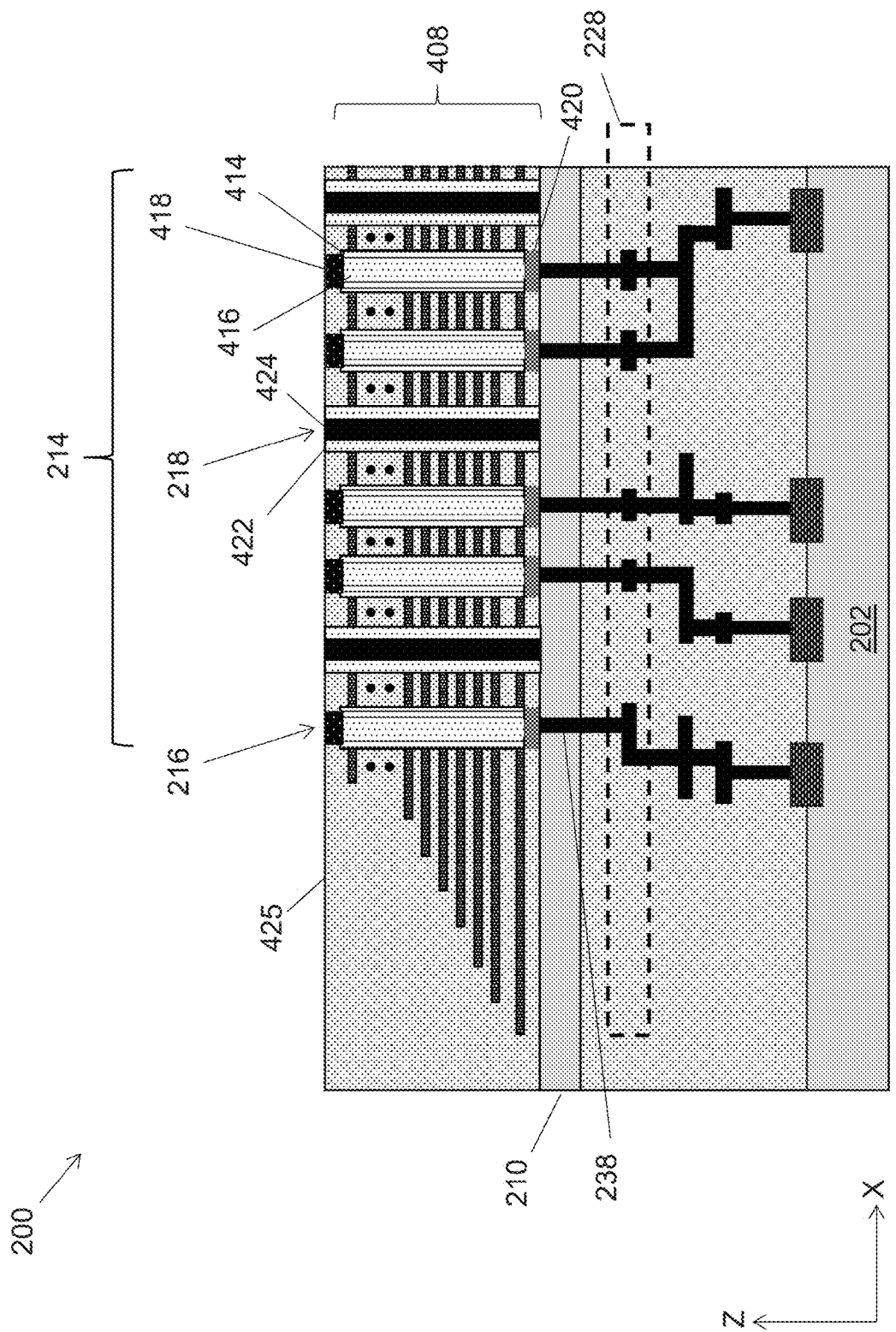

FIG. 4F illustrates the formation of vertical structures 214 through layer stack 408, according to some embodiments. Vertical structures 214 includes both NAND memory strings 216 and conductive contacts 218.

In some embodiments, NAND memory strings 216 include a plurality of memory layers 414 and a core insulator material 416 that extend between an epitaxially grown material 420 on semiconductor layer 210 and a top conductive material 418. Epitaxially grown material 420 can include epitaxially grown silicon, and may extend into a portion of semiconductor layer 210. Top conductive material 418 may include doped polysilicon or any other conductive material.

Plurality of memory layers 414 of each NAND memory string 216 can include a semiconductor channel layer, such as amorphous silicon, polysilicon, or single crystalline silicon. Plurality of memory layers 414 can also include a tunneling layer, a storage layer (also known as "charge trap/storage layer"), and a blocking layer. The blocking layer, the storage layer, the tunneling layer, and the semiconductor channel layer are arranged over one another on the sidewalls in the order listed (with the blocking layer deposited first and the semiconductor channel layer deposited last), according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, plurality of memory layers 414 includes silicon oxide/silicon nitride/silicon oxide (ONO) dielectrics (e.g., a tunneling layer including silicon oxide, a storage layer including silicon nitride, and a blocking layer including silicon oxide). Core insulator 416 can be any dielectric material, such as oxide, for example. In some embodiments, plurality of memory layers 414 surround core insulator 416. A diameter of NAND memory strings 216 can be between about 100 nm and 200 nm.

In some embodiments, the formation of NAND memory strings 216 includes etching a plurality of openings through layer stack 408 and into a portion of semiconductor layer 210. Epitaxially grown material 420 is then formed at the bottom of the plurality of openings, followed by deposition of plurality of memory layers 414 and deposition of core insulator 416, such that plurality of memory layers 414 surround core insulator 416. Top conductive material 418 can be formed over plurality of memory layers 414 and core insulator 416, and may be formed after etching a top portion of memory layers 414 and core insulator 416. Each of the various layers of plurality of memory layers 414 can be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD). Similarly, core insulator 416 can be formed using any of the techniques described above.

In some embodiments, NAND memory strings 216 are electrically coupled to corresponding bit lines in first set of conductive lines 228 using vias 238 extending through a thickness of semiconductor layer 210. Not every structure of vertical structures 214 includes a connection to a conductive line in first set of conductive lines 228. According to some embodiments, only NAND memory strings 216 are connected to corresponding conductive lines in first set of conductive lines 228.

Conductive contacts 218 can be TACs that each include a conductive core 424 surrounding by an insulating material 422. Conductive core 424 can include conductor materials including, but not limited to, tungsten (W), cobalt (Co), copper (Cu), aluminum (Al), silicides, or any combination thereof. Insulating material 422 can include silicon oxide, silicon nitride, silicon oxynitride, doped silicon oxide, or any combination thereof. Conductive core 424 and insulating material 422 can each be formed using any suitable deposition technique, such as sputtering, evaporation, or chemical vapor deposition (CVD). Example CVD techniques include plasma-enhanced CVD (PECVD), low pressure CVD (LPCVD), and atomic layer deposition (ALD).

According to some embodiments, a chemical mechanical polishing process (CMP) can be performed to planarize a top surface 425 of the semiconductor structure following the formation of plurality of vertical structures 214.

Figure 4G:
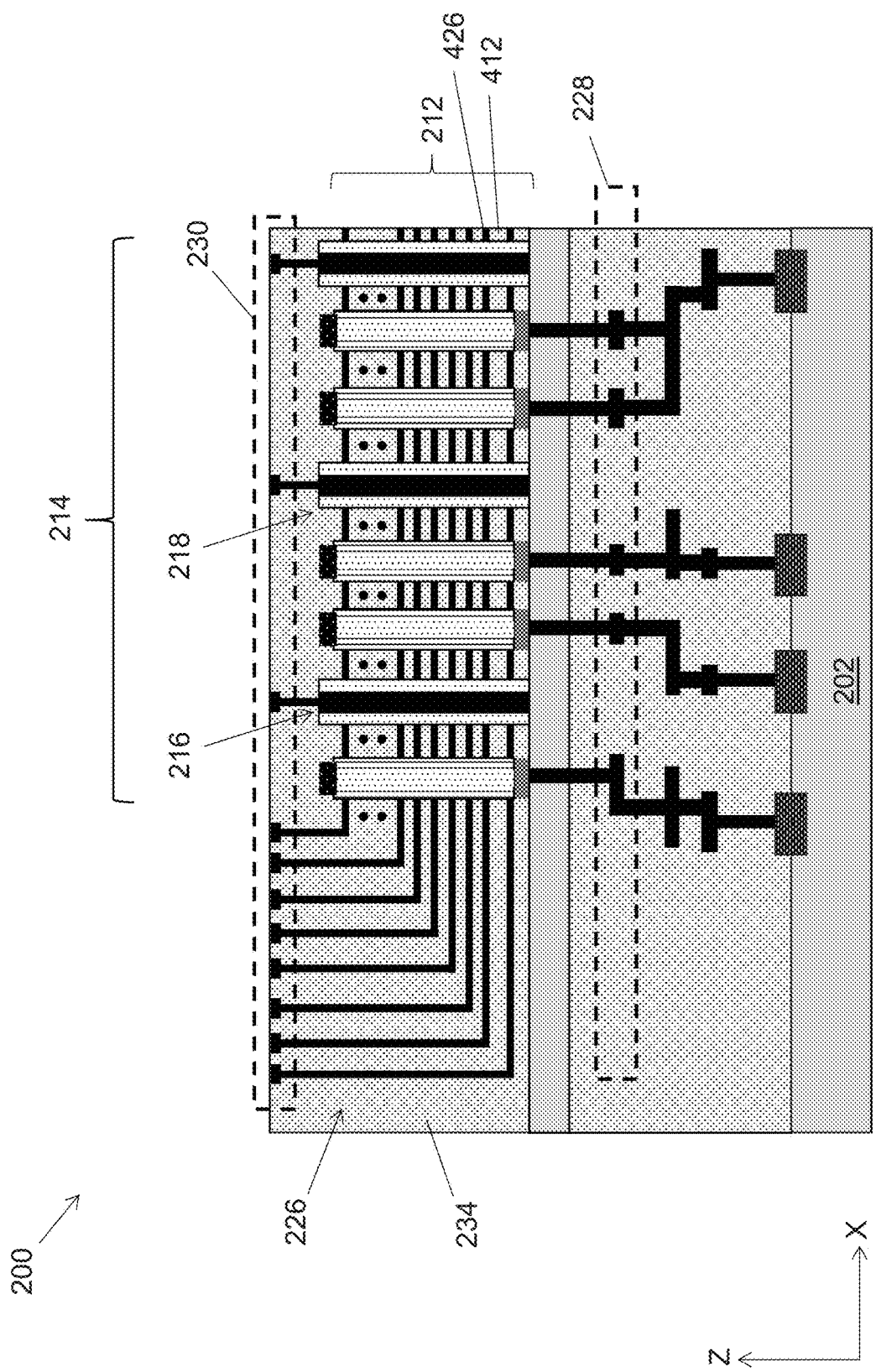

FIG. 4G illustrates additional fabricated structures and layers of memory device 200. According to some embodiments, sacrificial layers 410 of layer stack 408 are removed and replaced with conductor layers 426 to form layer stack 212 having alternating conductor layers 426 and dielectric layers 412. Conductor layers 426 can act as word lines for each of NAND memory strings 216. Sacrificial layers 410 can be removed by a suitable etching process, e.g., an isotropic dry etch or a wet etch. The etching process can have sufficiently high etching selectivity of the material of sacrificial layers 410 over the materials of other parts of the structure, such that the etching process can have minimal impact on the other parts of the structure. In some embodiments, sacrificial layers 410 include silicon nitride and the etchant of the isotropic dry etch includes one or more of $CF_4$, $CHF_3$, $C_4F_8$, $C_4F_6$, and $CH_2F_2$. The radio frequency (RF) power of the isotropic dry etch can be lower than about 100 W and the bias can be lower than about 10 V. In some embodiments, sacrificial layers 410 include silicon nitride and the etchant of the wet etch includes phosphoric acid. In some embodiments, dielectric layers 412 can be removed such that empty space (vacuum) exists between conductor layers 426. The vacuum space between conductor layers 426 acts as an insulating layer and may help reduce parasitic capacitance.

Conductor layers 426 can include conductor materials including, but not limited to, W, Co, Cu, Al, doped silicon, silicides, or any combination thereof. Each of conductor layers 426 can be deposited into the regions left behind by the removal of sacrificial layers 410 using a suitable deposition method such as CVD, sputtering, MOCVD, and/or ALD.

Contact is made to each of conductor layers 426 using vias 226 extending through dielectric material 234. A second set of conductive lines 230 are formed to make electrical contact with one or more of the word lines and to one or more of conductive contacts 218. Not every structure of vertical structures 214 includes a connection to a conductive line in second set of conductive lines 230. According to some embodiments, only conductive contacts 218 are connected to corresponding conductive lines in second set of conductive lines 230.

Figure 4H:
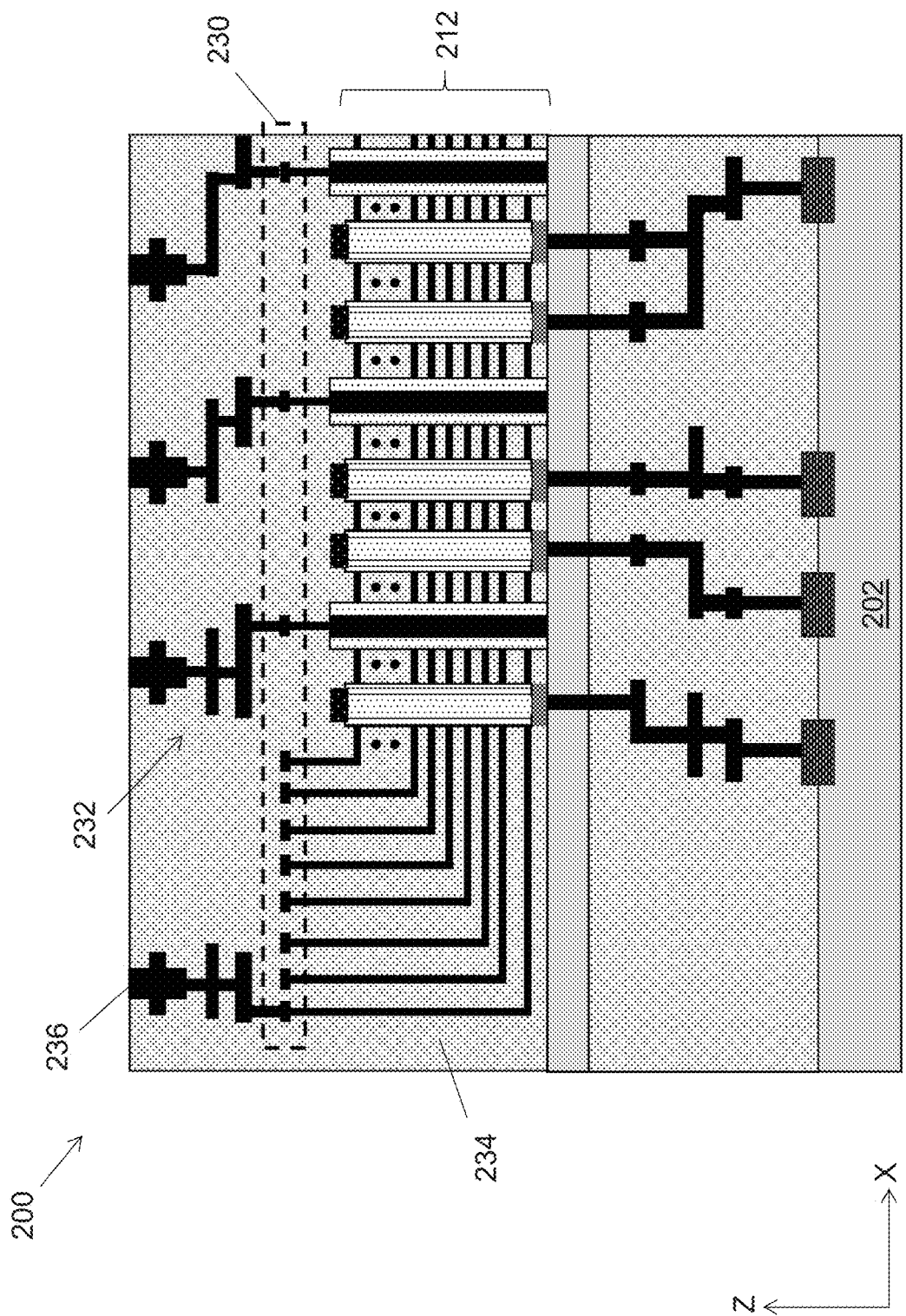

FIG. 4H illustrates the formation of one or more interconnect layers 232 making electrical connection with one or more of second set of conductive lines 230, according to some embodiments. Any number of interconnect layers may be formed with each having vias connecting different levels of conductor layers. Additional dielectric layers are also deposited to increase a total thickness of dielectric material 234.

According to some embodiments, conducive pads 236 are formed at a top surface of memory device 200. Conductive pads 236 can be used to provide electrical connection to external devices and their use would be well understood to a person skilled in the relevant art.

Figure 5A:
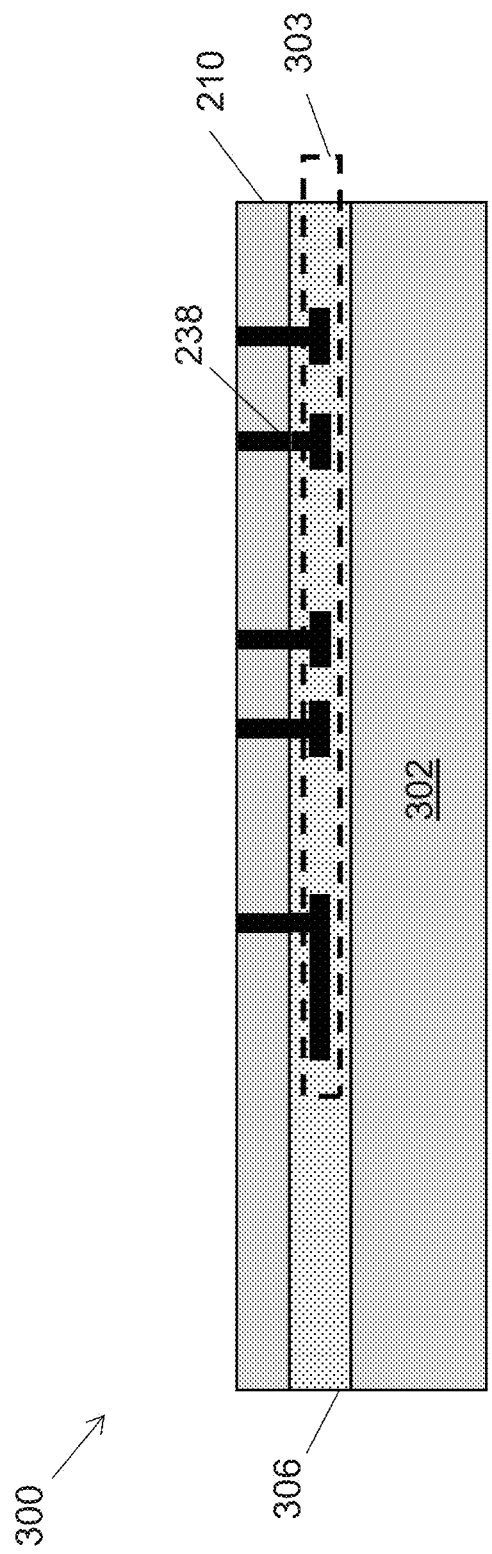
FIGS. 5A-5E illustrate side views of another three-dimensional memory structure at different stages of an exemplary fabrication process, according to some embodiments.

FIGS. 5A-5E illustrate an example fabrication process for forming memory device 300. FIG. 5A illustrates the formation of dielectric material 306 over a first surface of substrate 302. A first set of conductive lines 303 is formed within dielectric material 306.

A semiconductor layer 210 is subsequently formed over dielectric material 306. One or more vias 238 are formed through a thickness of semiconductor layer 210 and can make electrical connection with one or more of the conductive lines in first set of conductive lines 303.

Figure 5B:
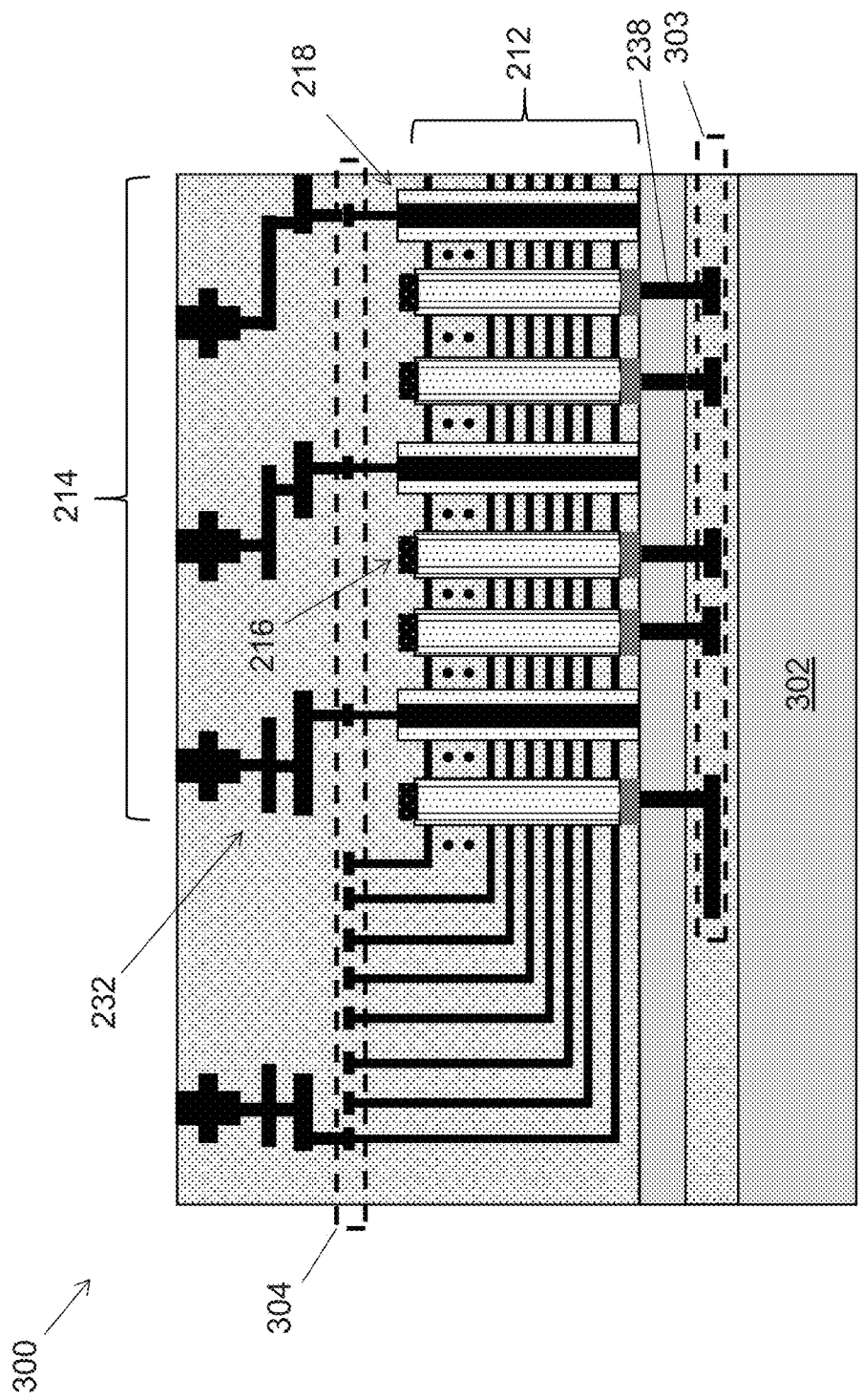

FIG. 5B illustrates the formation of plurality of vertical structures 214 through layer stack 212. Additionally, second set of conductive lines 304 is formed over plurality of vertical structures 214, and connections are made using conductive vias between conductive contacts 218 and corresponding conductive lines of second set of conductive lines 304, according to some embodiments. One or more interconnect layers 232 are formed having electrical connection with one or more conductive lines in second set of conductive lines 304. The details of the formation of these components is the same as described above for FIGS. 4E-4H.

Each of NAND memory strings 216 is electrically connected to a corresponding bit line of first set of conductive lines 303 using vias 238, according to some embodiments. According to some embodiments, only NAND memory strings 216 are electrically connected to bit lines in first set of conductive lines 303 and only conductive contacts 218 are electrically connected to conductive lines in second set of conductive lines 304.

Figure 5C:
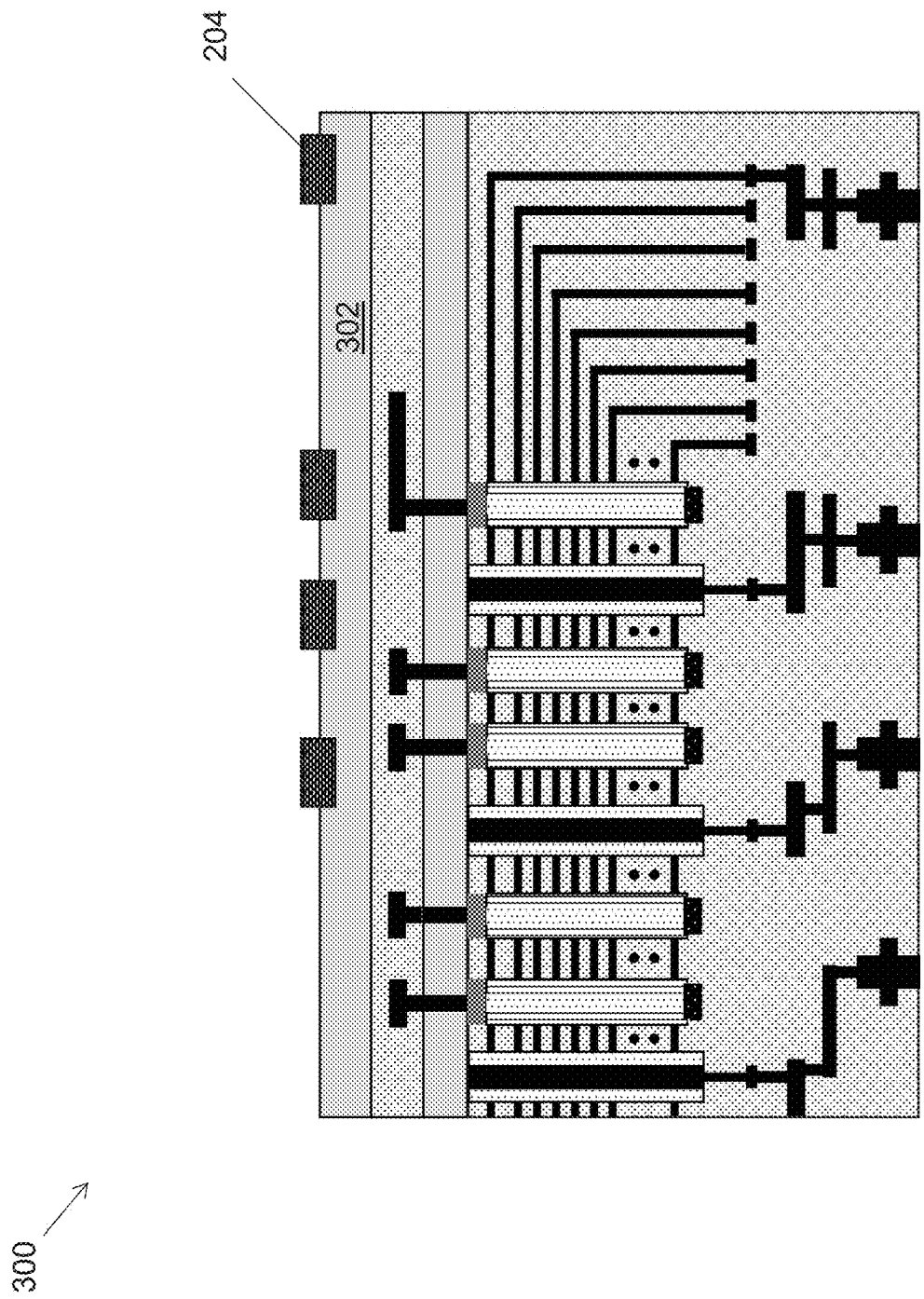

FIG. 5C illustrates the thinning of substrate 302 and subsequent formation of peripheral devices 204 on a second surface of substrate 302 opposite from the first surface, according to some embodiments. The formation of peripheral devices 204 is the same as described above for FIG. 4A.

Figure 5D:
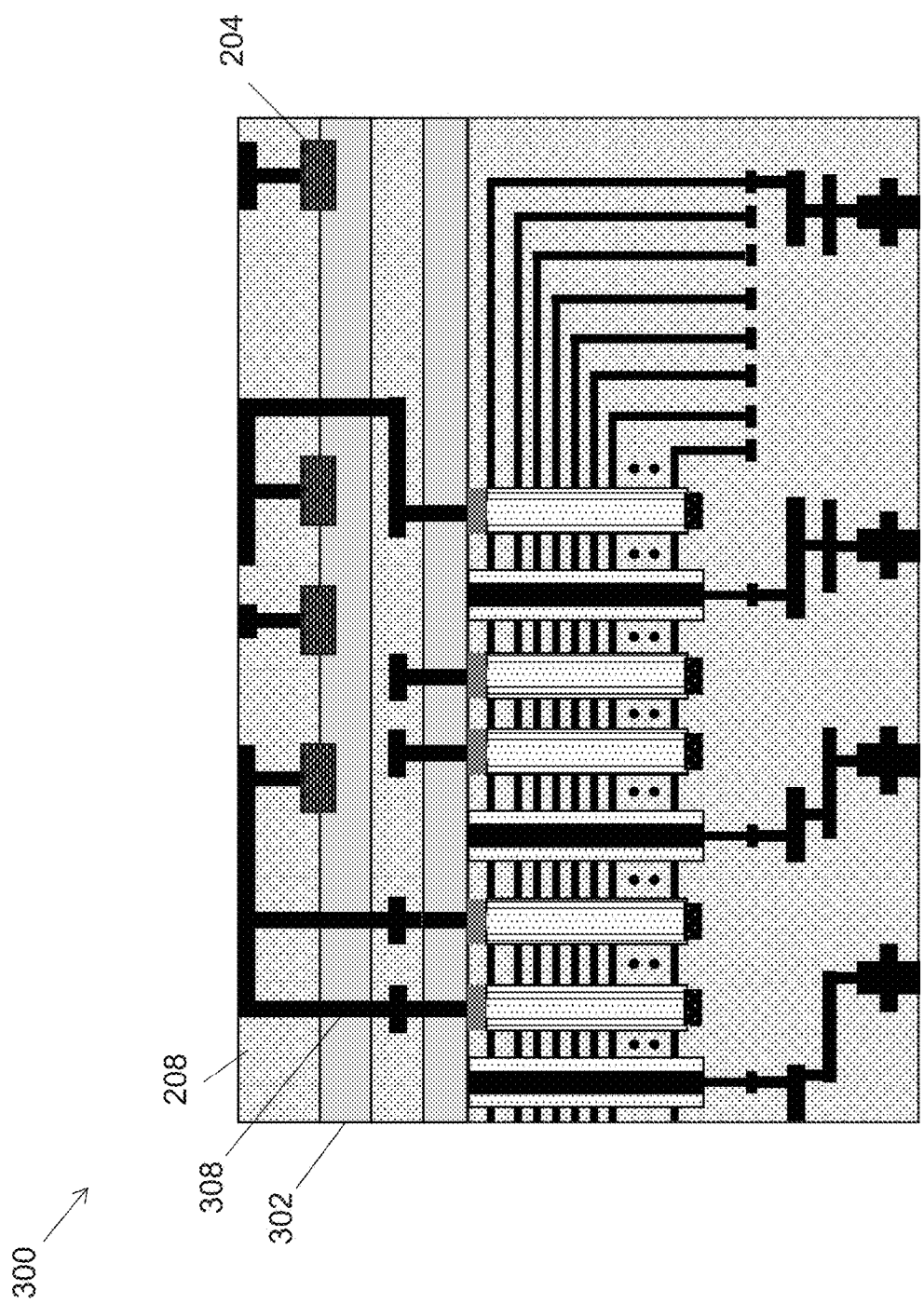

FIG. 5D illustrates the formation of dielectric material 208 over peripheral devices 204, and the formation of a first interconnect level within dielectric material 208. The first interconnect level provides electrical contact to peripheral devices 204 and also to one or more bit lines of first set of conductive lines 303 using vias 308 that extend through a thickness of the thinned substrate 302.

Figure 5E:
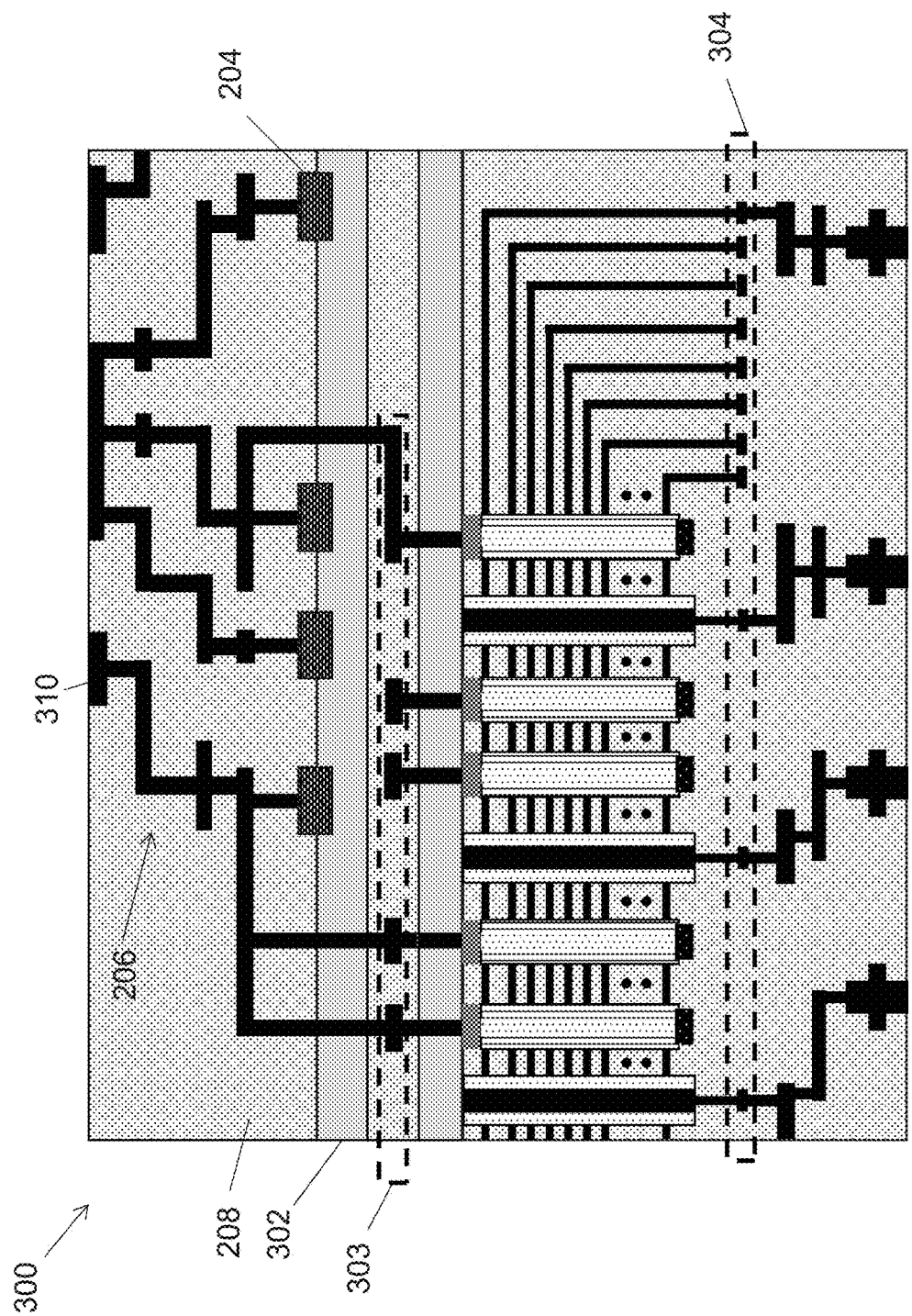

FIG. 5E illustrates the formation of the remainder of peripheral interconnect layers 206 making electrical connection with peripheral devices 204 and one or more bit lines of first set of conductive lines 303. The formation of peripheral interconnect layers 206 is the same as described above in FIG. 4C. According to some embodiments, conducive pads 310 are formed at a top surface of memory device 300. Conductive pads 310 can be used to provide electrical connection to external devices and their use would be well understood to a person skilled in the relevant art.

Figure 6:
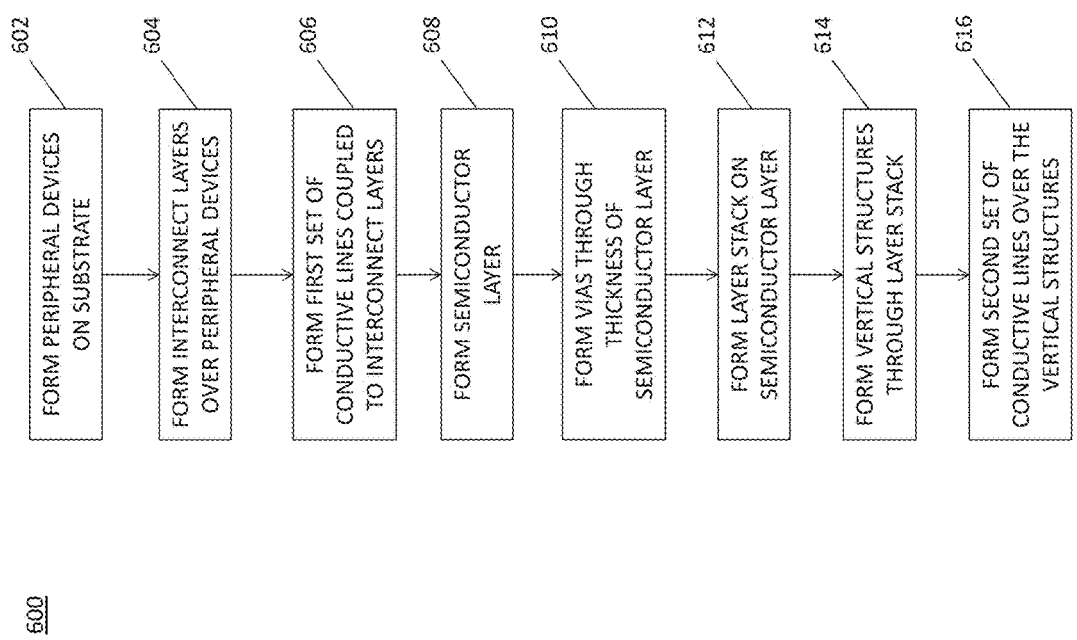
FIG. 6 is an illustration of a fabrication process for forming a three-dimensional memory structure, according to some embodiments.

FIG. 6 is a flowchart of an exemplary method 600 for forming a NAND memory device, according to the first embodiment. The operations of method 600 are generally illustrated in FIGS. 4A-4H. It should be understood that the operations shown in method 600 are not exhaustive and that other operations can be performed as well before, after, or between any of the illustrated operations. In various embodiments of the present disclosure, the operations of method 600 can be performed in a different order and/or vary.

In operation 602, peripheral devices are formed on a substrate. The peripheral devices can include a plurality of transistors formed on the substrate. The peripheral devices can include any arrangement of transistors or electrically passive devices (e.g., capacitors, resistors, etc.) The transistors can be formed by a plurality of processing steps including, but not limited to, photolithography, dry/wet etch, thin film deposition, thermal growth, implantation, chemical mechanical polishing (CMP), or any combination thereof. In some embodiments, doped regions are formed in the substrate, which function, for example, as source regions and/or drain regions of the transistors. In some embodiments, isolation regions, such as shallow trench isolation (STI), is also formed in the substrate.

In operation 604, one or more interconnect layers are formed over the peripheral devices. Any number of interconnect layers may be formed each having vias connecting different levels of conductor layers. A dielectric material can be deposited to surround the one or more interconnect layers.

In operation 606, a first set of conductive lines is formed and are electrically coupled to the one or more interconnect layers. The first set of conductive lines can also be considered to be one layer of the one or more interconnect layers.

In operation 608, a semiconductor layer is formed over the one or more interconnect layers. The semiconductor layer can also be formed over the first set of conductive lines. The semiconductor layer can be deposited using well-known vapor deposition techniques such as chemical vapor deposition (CVD) or physical vapor deposition (PVD) techniques. In some embodiments the semiconductor layer is epitaxially grown silicon.

In operation 610, one or more vias are formed through a thickness of the semiconductor layer. The one or more vias make electrical contact with the first set of conductive lines, according to some embodiments.

In operation 612, a layer stack having alternating conductor and insulator layers is formed on the semiconductor layer. The formation of the layer stack can involve first depositing alternating types of dielectric materials (e.g., sacrificial layers alternating with dielectric layers). The layers of the alternating dielectric stack can include materials including, but not limited to, silicon oxide, silicon nitride, silicon oxynitride, or any combination thereof. The layers of the alternating dielectric stack can include dielectric materials deposited by one or more thin film deposition processes including, but not limited to, CVD, PVD, ALD, or any combination thereof. At a later time, the sacrificial layers can be removed and replaced by conductor layers to form the alternating conductor and insulator layers. The insulator layers may be dielectric layers, or may be regions of vacuum between the conductor layers.

In operation 614, a plurality of vertical structures are formed through the layer stack. The vertical structures can include one or more NAND memory strings having a plurality of memory layers surrounding a core insulator. Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide). The one or more NAND memory strings can be formed above the vias formed in operation 610, such that only the one or more NAND memory strings are electrically connected to corresponding bit lines in the first set of conductive lines using the vias.

Other vertical structures can include conductive contacts such as TACs that include a core conductive material that extends vertically through the layer stack.

According to some embodiments, any first set of the vertical structures can be coupled to corresponding conductive lines in the first set of conductive lines using the vias.

In operation 616, a second set of conductive lines is formed that is coupled to a second set of the vertical structures. The second set of vertical structures is different from the first set of vertical structures, though some of the vertical structures may be in both the first and second sets. According to some embodiments, the second set of vertical structures can include any number of NAND strings and vertical conductive contacts. In one example, the second set of vertical structures includes only the vertical conductive contacts.

According to some embodiments, the second set of conductive lines are formed on a different plane than the first set of conductive lines either above or below the plurality of vertical structures. The second set of conductive lines can be formed over an opposite end vertically distanced from the plurality of vertical structures compared to the first set of conductive lines. By staggering the position of the various conductive lines on two different planes, the density of conductive lines on a given plane is reduced.

Figure 7:
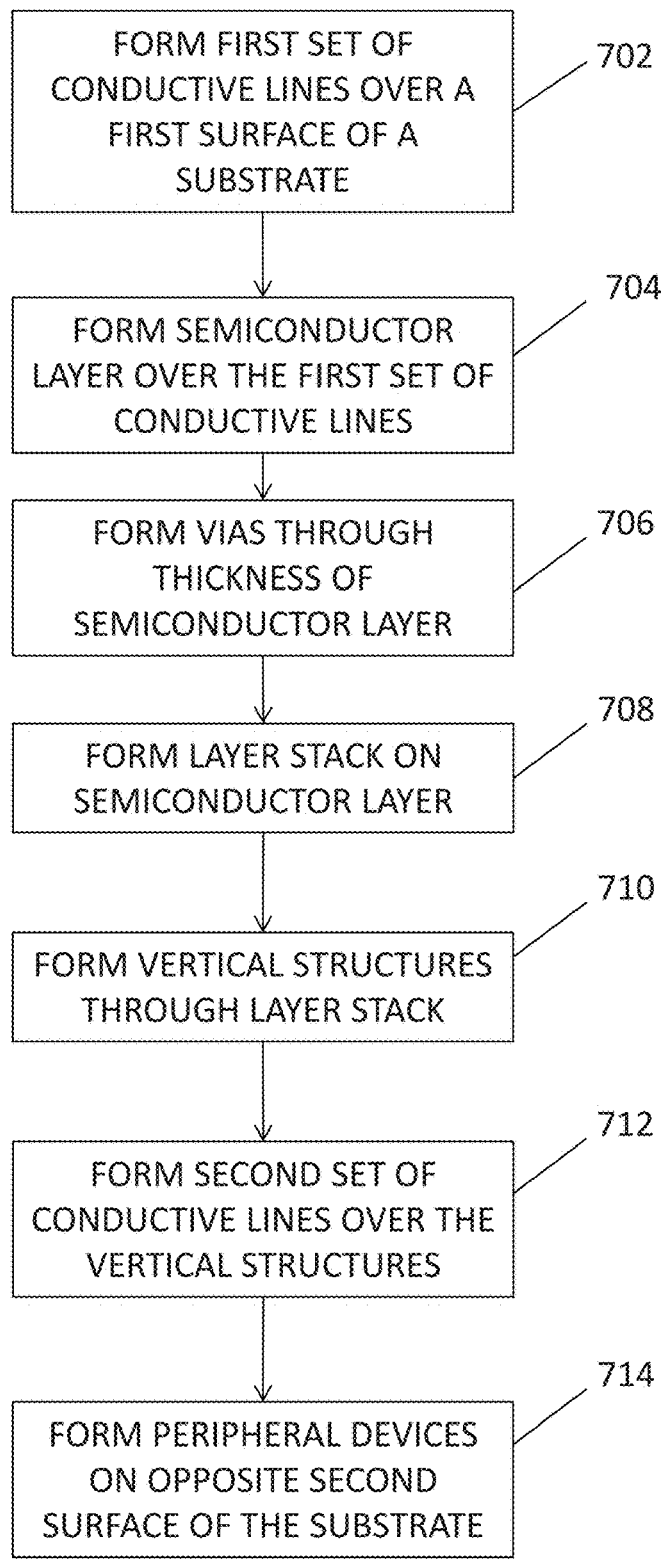
FIG. 7 is an illustration of another fabrication process for forming a three-dimensional memory structure, according to some embodiments.

FIG. 7 is a flowchart of an exemplary method 700 for forming a NAND memory device, according to the first embodiment. The operations of method 700 are generally illustrated in FIGS. 5A-5E. It should be understood that the operations shown in method 700 are not exhaustive and that other operations can be performed as well before, after, or between any of the illustrated operations. In various embodiments of the present disclosure, the operations of method 700 can be performed in a different order and/or vary.

In operation 702, a first set of conductive lines are formed over a first surface of a substrate. The first set of conductive lines can be formed within a dielectric material deposited first over the first surface of the substrate.

In operation 704, a semiconductor layer is formed over the first set of conductive lines in the dielectric material. The semiconductor layer can be deposited using well-known vapor deposition techniques such as chemical vapor deposition (CVD) or physical vapor deposition (PVD) techniques. In some embodiments the semiconductor layer is epitaxially grown silicon.

In operation 706, one or more vias are formed through a thickness of the semiconductor layer. The one or more vias make electrical contact with the first set of conductive lines, according to some embodiments.

In operation 708, a layer stack having alternating conductor and insulator layers is formed on the semiconductor layer. The formation of the layer stack can involve first depositing alternating types of dielectric materials (e.g., sacrificial layers alternating with dielectric layers). The layers of the alternating dielectric stack can include materials including, but not limited to, silicon oxide, silicon nitride, silicon oxynitride, or any combination thereof. The layers of the alternating dielectric stack can include dielectric materials deposited by one or more thin film deposition processes including, but not limited to, CVD, PVD, ALD, or any combination thereof. At a later time, the sacrificial layers can be removed and replaced by conductor layers to form the alternating conductor and insulator layers. The insulator layers may be dielectric layers, or may be regions of vacuum between the conductor layers.

In operation 710, a plurality of vertical structures are formed through the layer stack. The vertical structures can include one or more NAND memory strings having a plurality of memory layers surrounding a core insulator. Forming the plurality of memory layers may include depositing a semiconductor channel layer, such as amorphous silicon, polysilicon, or single crystalline silicon, a tunneling layer, a storage layer (also known as "charge trap/storage layer"), and a blocking layer. The blocking layer, the storage layer, the tunneling layer, and the semiconductor channel layer may each be deposited in the order listed on the sidewalls of the one or more first openings, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, the plurality of memory layers includes silicon oxide/silicon nitride/silicon oxide (ONO) dielectrics (e.g., a tunneling layer including silicon oxide, a storage layer including silicon nitride, and a blocking layer including silicon oxide). The one or more NAND memory strings can be formed above the vias formed in operation 706, such that only the one or more NAND memory strings are electrically connected to corresponding bit lines in the first set of conductive lines using the vias.

Other vertical structures can include conductive contacts such as TACs that include a core conductive material that extends vertically through the layer stack.

According to some embodiments, any first set of the vertical structures can be coupled to corresponding conductive lines in the first set of conductive lines using the vias.

In operation 712, a second set of conductive lines is formed over an opposite end of the vertical structures from the first set of conductive lines. The second set of conductive lines is coupled to a second set of the vertical structures. The second set of vertical structures is different from the first set of vertical structures, though some of the vertical structures may be in both the first and second sets. According to some embodiments, the second set of vertical structures can include any number of NAND strings and vertical conductive contacts. In one example, the second set of vertical structures includes only the vertical conductive contacts.

According to some embodiments, the second set of conductive lines are formed on a different plane than the first set of conductive lines either above or below the plurality of vertical structures. The second set of conductive lines can be formed over an opposite end vertically distanced from the plurality of vertical structures compared to the first set of conductive lines. By staggering the position of the various conductive lines on two different planes, the density of conductive lines on a given plane is reduced.

In operation 714, peripheral devices are formed on a second surface of the substrate opposite from the first surface. In some embodiments, the substrate is thinned before the formation of the peripheral devices. The peripheral devices are formed in the same way as described above in operation 602, and may also include one or more interconnect layers connected to the peripheral devices. The one or more interconnect layers can also make electrical connection with one or more of the bit lines in the first set of conductive lines using conductive vias passing through a thickness of the substrate.

The present disclosure describes various embodiments of three-dimensional memory devices and methods of making the same. In some embodiments, a memory device includes substrate and one or more peripheral devices on the substrate. The memory device also includes one or more interconnect layers electrically coupled with the one or more peripheral devices, and a semiconductor layer disposed over the one or more interconnect layers. A layer stack having alternating conductor and insulator layers is disposed above the semiconductor layer. A plurality of structures extend vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures.

In some embodiments, a memory device includes a substrate, a dielectric material disposed on a first surface of the substrate, a semiconductor layer disposed on the dielectric material, and a layer stack having alternating conductor and insulator layers disposed on the semiconductor layer. The memory device also includes a plurality of structures extending vertically through the layer stack. The memory device also includes a first set of conductive lines electrically coupled with a first set of the plurality of structures and a second set of conductive lines electrically coupled with a second set of the plurality of structures different from the first set. The first set of conductive lines are vertically distanced from one end of the plurality of structures and the second set of conductive lines are vertically distanced from an opposite end of the plurality of structures. The memory device also includes one or more peripheral devices formed on a second surface of the substrate, the second surface being opposite to the first surface.

In some embodiments, a method to form a memory device includes forming one or more peripheral devices on a substrate and one or more interconnect layers over the one or more peripheral devices. The one or more interconnect layers are electrically coupled with the one or more peripheral devices. The method also includes forming a first set of conductive lines electrically coupled with the one or more interconnect layers, and forming a semiconductor layer over the first set of conductive lines. The method includes forming vias through a thickness of the semiconductor layer where the vias are electrically coupled to the first set of conductive lines. The method also includes forming, on the semiconductor layer, a layer stack having alternating conductor and insulator layers. The method includes forming a plurality of structures each extending vertically through the layer stack. A first set of the plurality of structures is electrically coupled to the first set of conductive lines using the vias. The method also includes forming a second set of conductive lines over an end vertically distanced from the plurality of structures. The second set of conductive lines is electrically coupled to a second set of the plurality of structures different from the first set.

In some embodiments, a method to form a memory device includes forming a first set of conductive lines over a first surface of a substrate, the first set of conductive lines being surrounded by a dielectric layer on the first surface of the substrate. The method also includes forming a semiconductor layer over the first set of conductive lines, and forming vias through a thickness of the semiconductor layer. The vias are electrically coupled to the first set of conductive lines. The method also includes forming, on the semiconductor layer, a layer stack having alternating conductor and insulator layers. The method includes forming a plurality of structures each extending vertically through the layer stack. A first set of the plurality of structures is electrically coupled to the first set of conductive lines using the vias. The method also includes forming a second set of conductive lines over an end vertically distanced from the plurality of structures. The second set of conductive lines are electrically coupled to a second set of the plurality of structures different from the first set. The method also includes forming one or more peripheral devices on a second surface of the substrate opposite from the first surface.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a semiconductor layer;
a layer stack having alternating conductor and insulator layers disposed on the semiconductor layer; and
a first set of vertical structures and a second set of vertical structures extending vertically through the layer stack and electrically coupled with a first set of conductive lines and a second set of conductive lines, respectively, wherein the first set of conductive lines and the second set of conductive lines are located on opposite sides of the semiconductor layer.

2. The memory device of claim 1, wherein the first set of vertical structures and the second set of vertical structures comprise NAND memory strings.

3. The memory device of claim 2, wherein the NAND memory strings each includes a plurality of layers surrounding a core insulating material, the plurality of layers comprising a blocking layer, a storage layer, a tunneling layer, and a channel layer.

4. The memory device of claim 2, wherein the first set of vertical structures includes a first set of the NAND memory strings and the second set of vertical structures includes a second set of the NAND memory strings different from the first set of the NAND memory strings.

5. The memory device of claim 2, wherein the first set of vertical structures and the second set of vertical structures comprise conductive contacts.

6. The memory device of claim 5, wherein the first set of vertical structures include the NAND memory strings and the second set of vertical structures include the conductive contacts.

7. The memory device of claim 5, wherein the first set of conductive lines and the second set of conductive lines comprise contact lines coupled to the conductive contacts.

8. The memory device of claim 2, wherein the first set of conductive lines and the second set of conductive lines are staggered with a comb-like arrangement.

9. The memory device of claim 2, wherein
the NAND memory strings further comprise bit lines alternating between the first set of conductive lines and the second set of conductive lines.

10. The memory device of claim 2, wherein
the NAND memory strings further comprise word lines alternating between the first set of conductive lines and the second set of conductive lines.

11. The memory device of claim 1, further comprising:
a first plurality of vias extending through the semiconductor layer, wherein the first plurality of vias electrically connect the first set of conductive lines and the first set of vertical structures.

12. The memory device of claim 1,
wherein the first set of conductive lines are vertically distanced from one end of the first set of vertical structures and the second set of vertical structures; and
wherein the second set of conductive lines are vertically distanced from an opposite end of the first set of vertical structures and the second set of vertical structures.

13. The memory device of claim 1, further comprising:
one or more peripheral devices formed on a substrate; and
one or more first interconnect layers disposed over the one or more peripheral devices, wherein the one or more first interconnect layers are electrically coupled with the one or more peripheral devices and the first set of conductive lines.

14. The memory device of claim 13, wherein the semiconductor layer is disposed over the one or more first interconnect layers.

15. The memory device claim 13, further comprising:
a dielectric material, wherein
the dielectric material and the one or more peripheral devices are disposed on opposite sides of the substrate; and
the semiconductor layer is disposed on the dielectric material.

16. The memory device of claim 15, wherein the first set of conductive lines are disposed in the dielectric material.

17. The memory device of claim 15, further comprising:
a second plurality of vias extending through the substrate, wherein the second plurality of vias electrically contact the first set of conductive lines and the one or more first interconnect layers.

18. The memory device of claim 17, wherein the one or more first interconnect layers comprise a first plurality of conductive pads configured to provide electrical connection to a first plurality of external devices.

19. The memory device of claim 1, further comprising:
one or more second interconnect layers, electrically coupled to the second set of conductive lines.

20. The memory device of claim 19, wherein the one or more second interconnect layers comprise a second plurality of conductive pads configured to provide electrical connection to a second plurality of external devices.

* * * * *